United States Patent [19]
Koai et al.

[11] Patent Number: 6,063,441
[45] Date of Patent: May 16, 2000

[54] PROCESSING CHAMBER AND METHOD FOR CONFINING PLASMA

[75] Inventors: Keith Koai, Los Gatos; Lawrence Chung-Lai Lei, Milpitas; Mei Chang, Saratoga; Mark S. Johnson, San Jose, all of Calif.

[73] Assignee: Applied Materials, Inc., Santa Clara, Calif.

[21] Appl. No.: 08/982,727

[22] Filed: Dec. 2, 1997

[51] Int. Cl.[7] .................................................. C23C 16/00
[52] U.S. Cl. .................. 427/248.1; 427/569; 427/579; 427/255.391; 427/255.394; 438/680; 438/685
[58] Field of Search ................... 438/656, 680, 438/685; 427/569, 579, 248.1, 255.391, 255.394

[56] References Cited

U.S. PATENT DOCUMENTS

| | | | |
|---|---|---|---|
| 4,951,601 | 8/1990 | Maydan et al. | 118/719 |
| 5,246,881 | 9/1993 | Sandhu et al. | 437/192 |
| 5,366,585 | 11/1994 | Robertson et al. | 156/643 |
| 5,516,367 | 5/1996 | Lei et al. | 118/725 |
| 5,558,717 | 9/1996 | Zhao et al. | 118/715 |
| 5,846,332 | 12/1998 | Zhao et al. | 118/728 |
| 5,853,607 | 12/1998 | Zhao et al. | 252/8 |
| 5,885,356 | 3/1999 | Zhao et al. | 118/723 ER |

FOREIGN PATENT DOCUMENTS

| | | |
|---|---|---|
| 0 714 998 A2 | 11/1995 | European Pat. Off. . |
| 0 780 490 A1 | 7/1996 | European Pat. Off. . |

OTHER PUBLICATIONS

International Search Report—Mar. 22, 1999.

*Primary Examiner*—Ngoclan Mai
*Attorney, Agent, or Firm*—Townsend & Townsend

[57] ABSTRACT

A substrate processing chamber, particularly a chemical vapor deposition (CVD) chamber used both for thermal deposition of a conductive material and a subsequently performed plasma process. The invention reduces thermal deposition of the conductive material on peripheral portions of the pedestal supporting a wafer and in a pumping channel exhausting the chamber. A peripheral ring placed on the pedestal, preferably also used to center the wafer, is thermally isolated from the pedestal so that its temperature is kept substantially lower than that of the wafer. The processing chamber includes a chamber lid assembly having an isolator ring member that has a sloping surface for confirming the plasma within a processing zone of the processing chamber while the wafer is being processed therein. A method for forming a CVD layer on a wafer comprising elevating the pedestal until an upper pedestal surface of the pedestal extends above a lower edge of the isolator ring member.

7 Claims, 25 Drawing Sheets

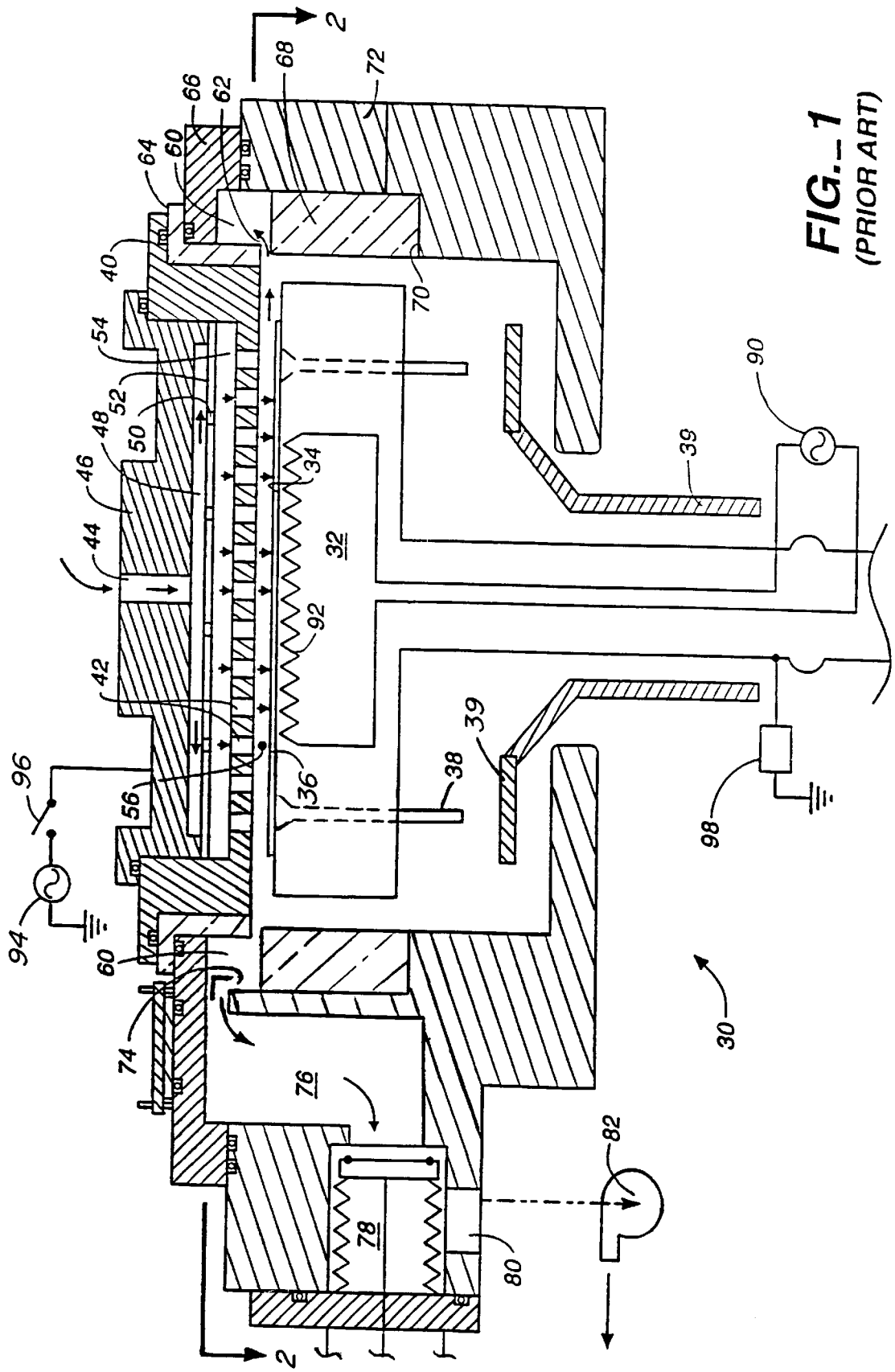
FIG._1 (PRIOR ART)

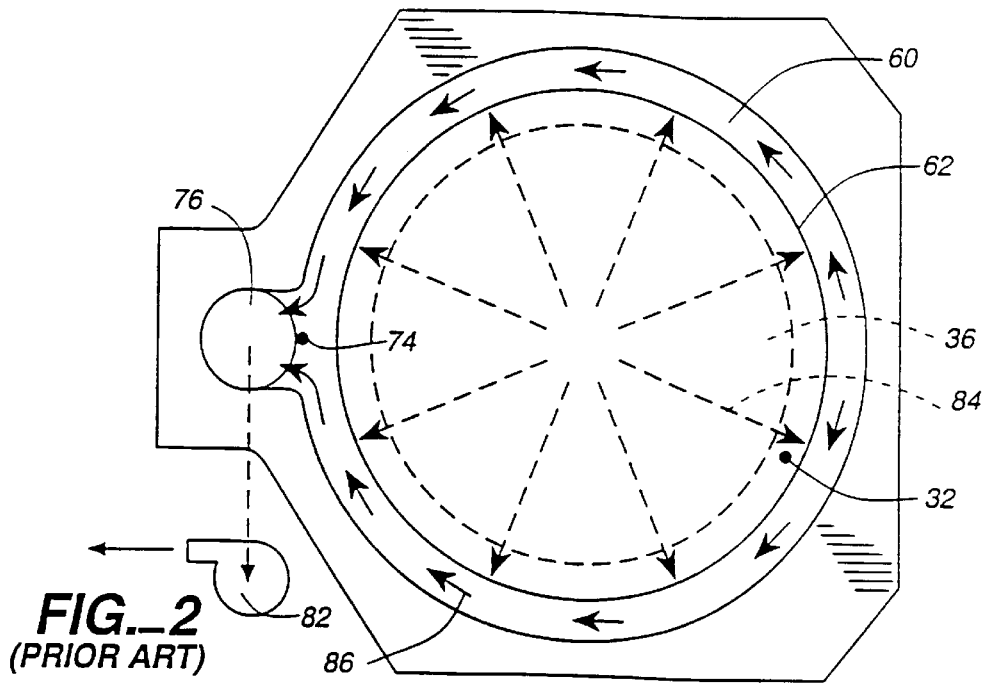
FIG._2
(PRIOR ART)
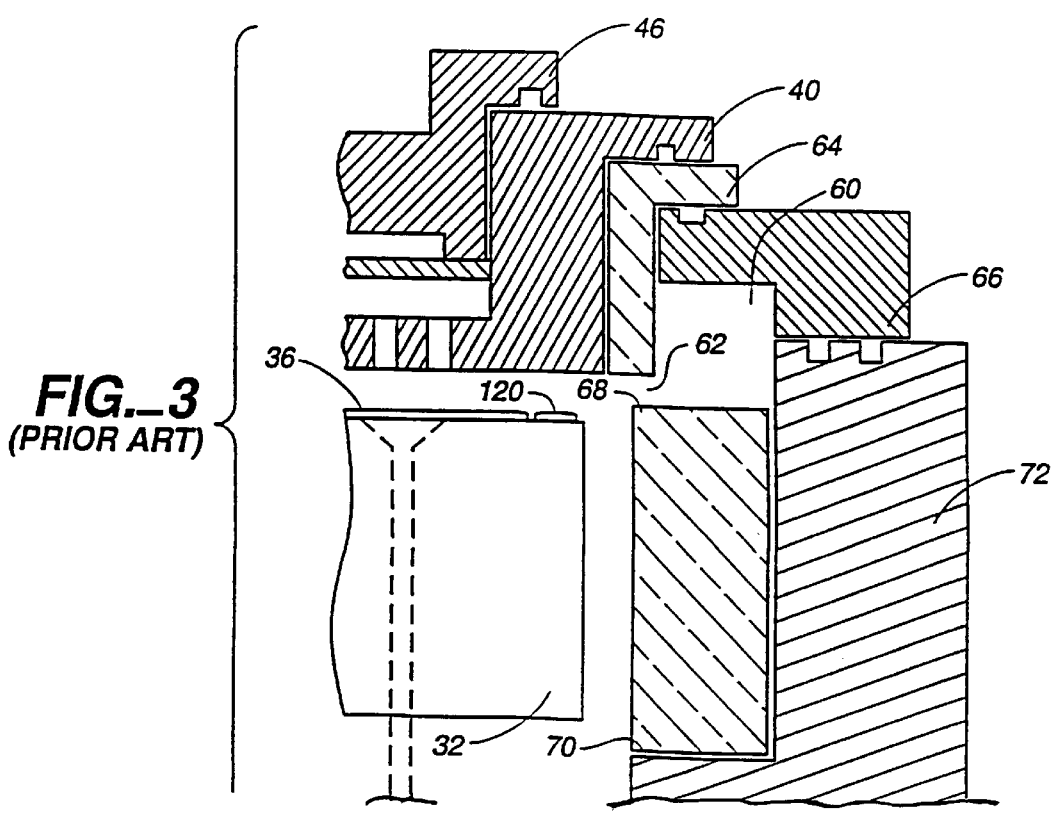
FIG._3
(PRIOR ART)

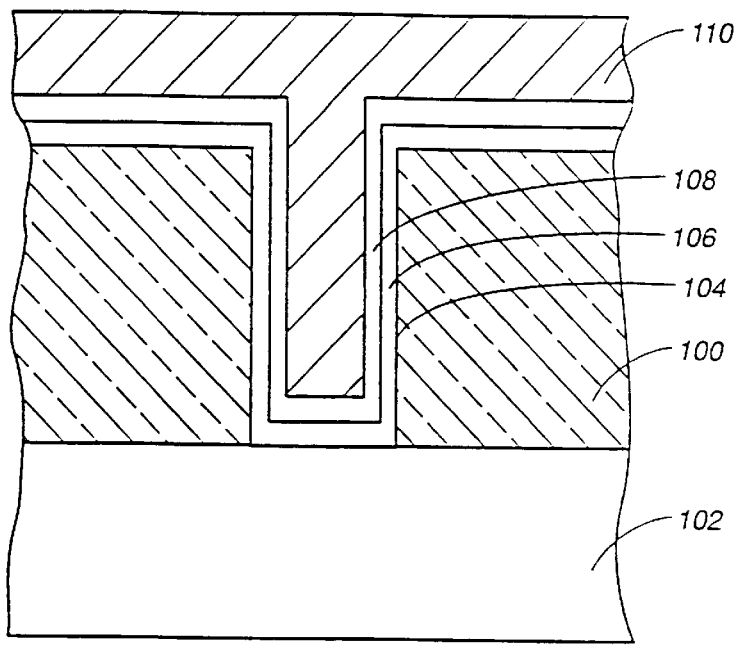
FIG._4
(PRIOR ART)
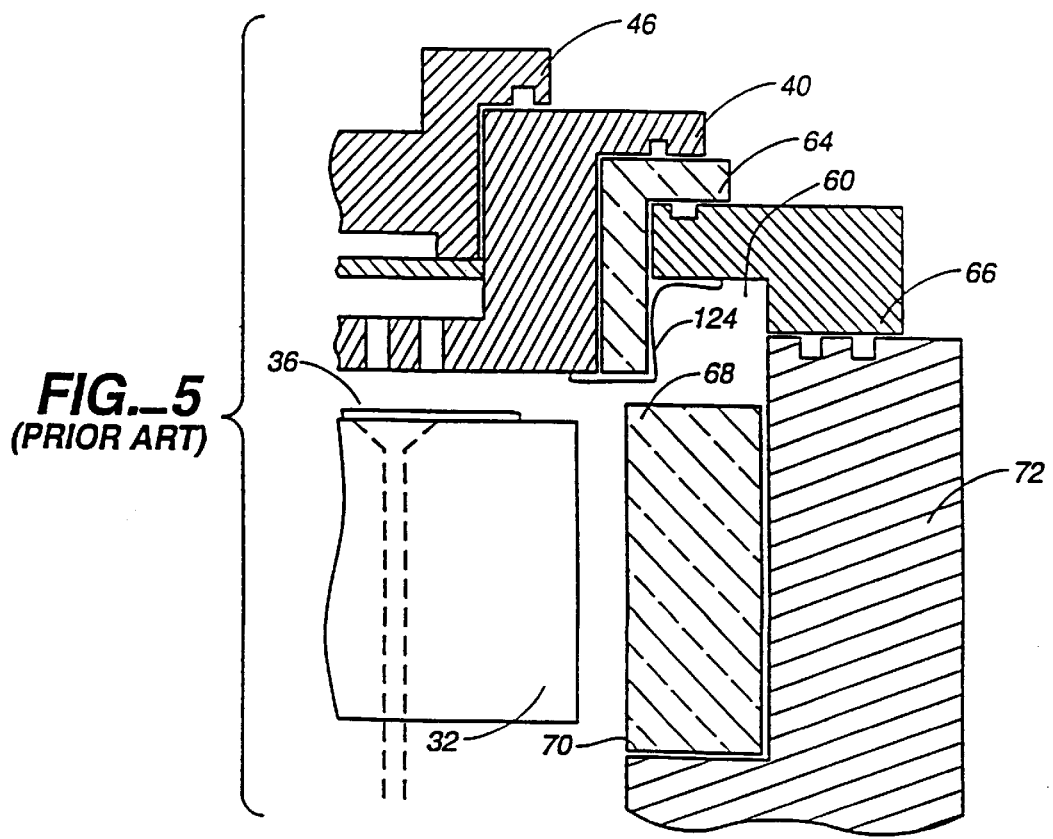
FIG._5
(PRIOR ART)

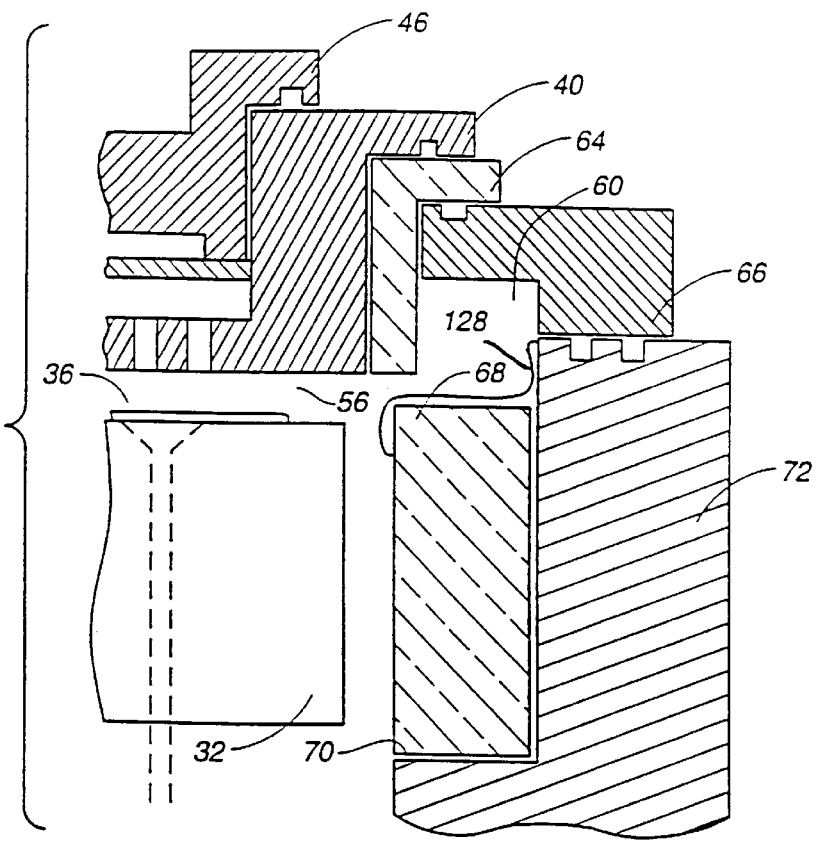
FIG._6
(PRIOR ART)
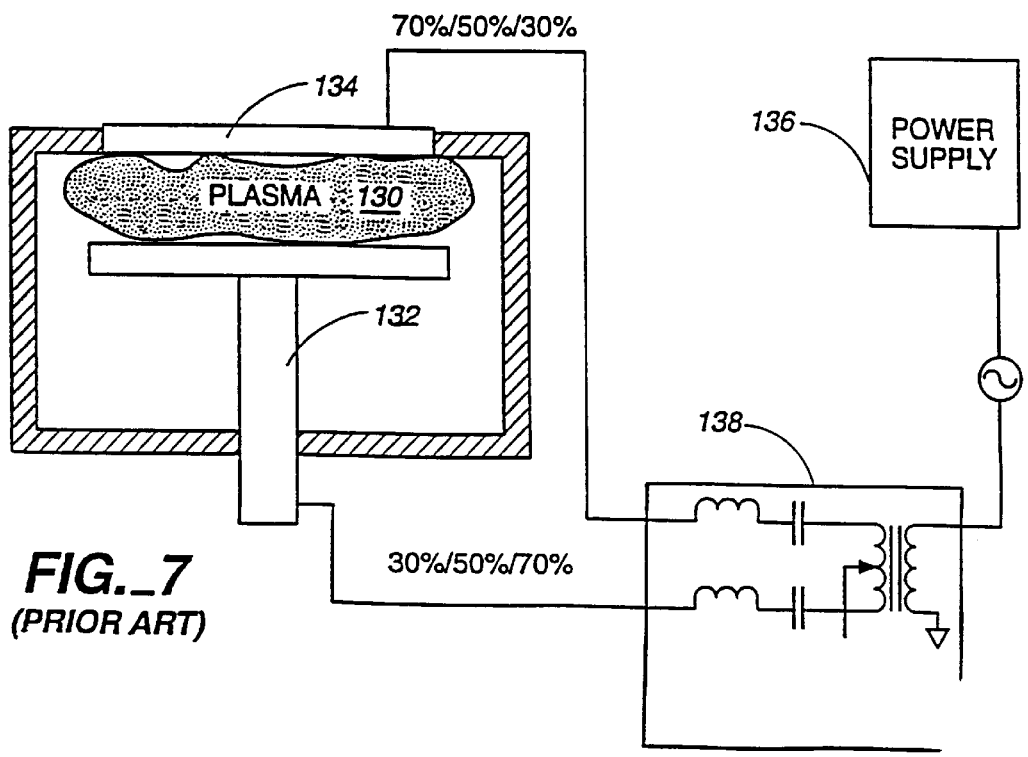
FIG._7
(PRIOR ART)

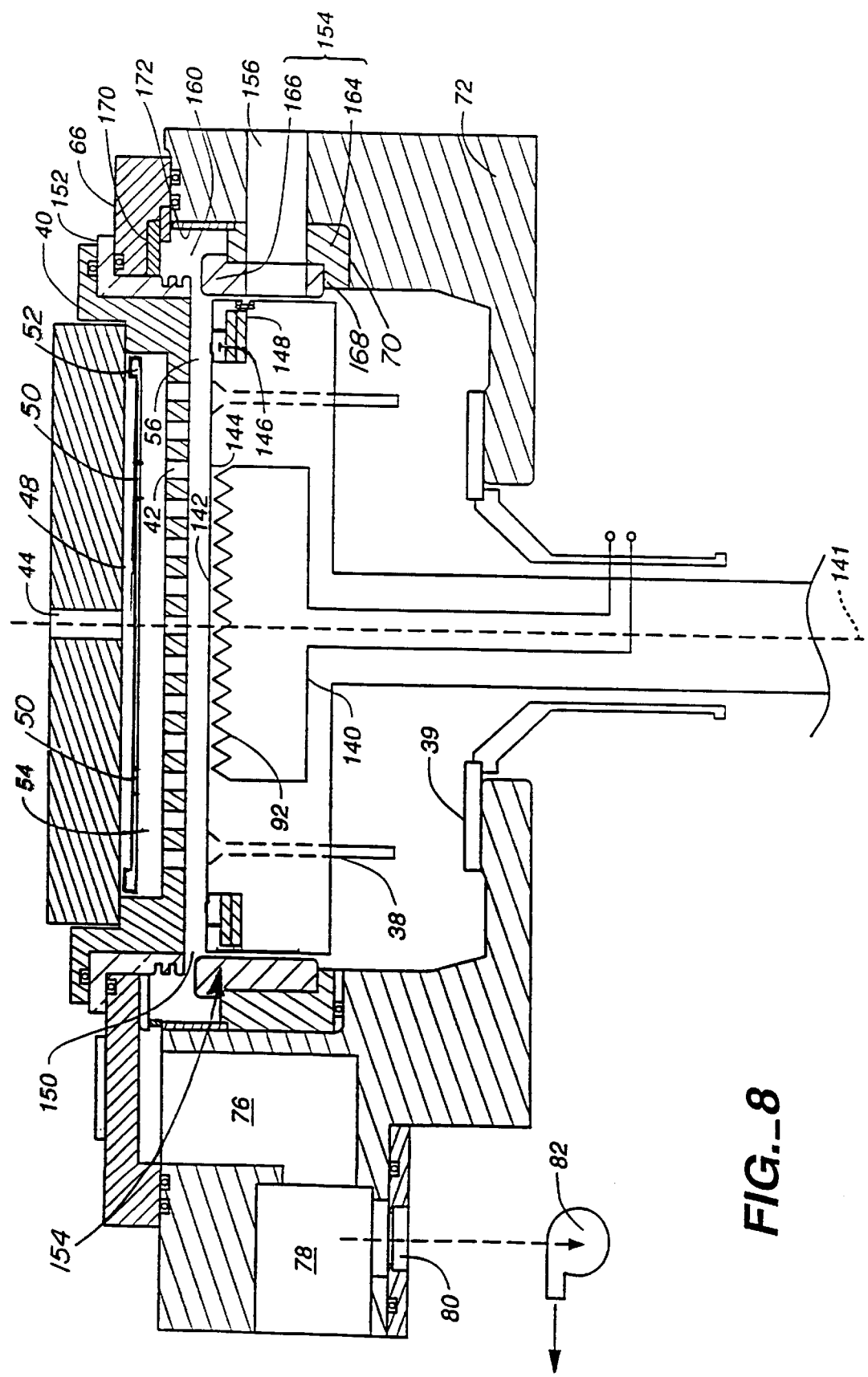
FIG._8

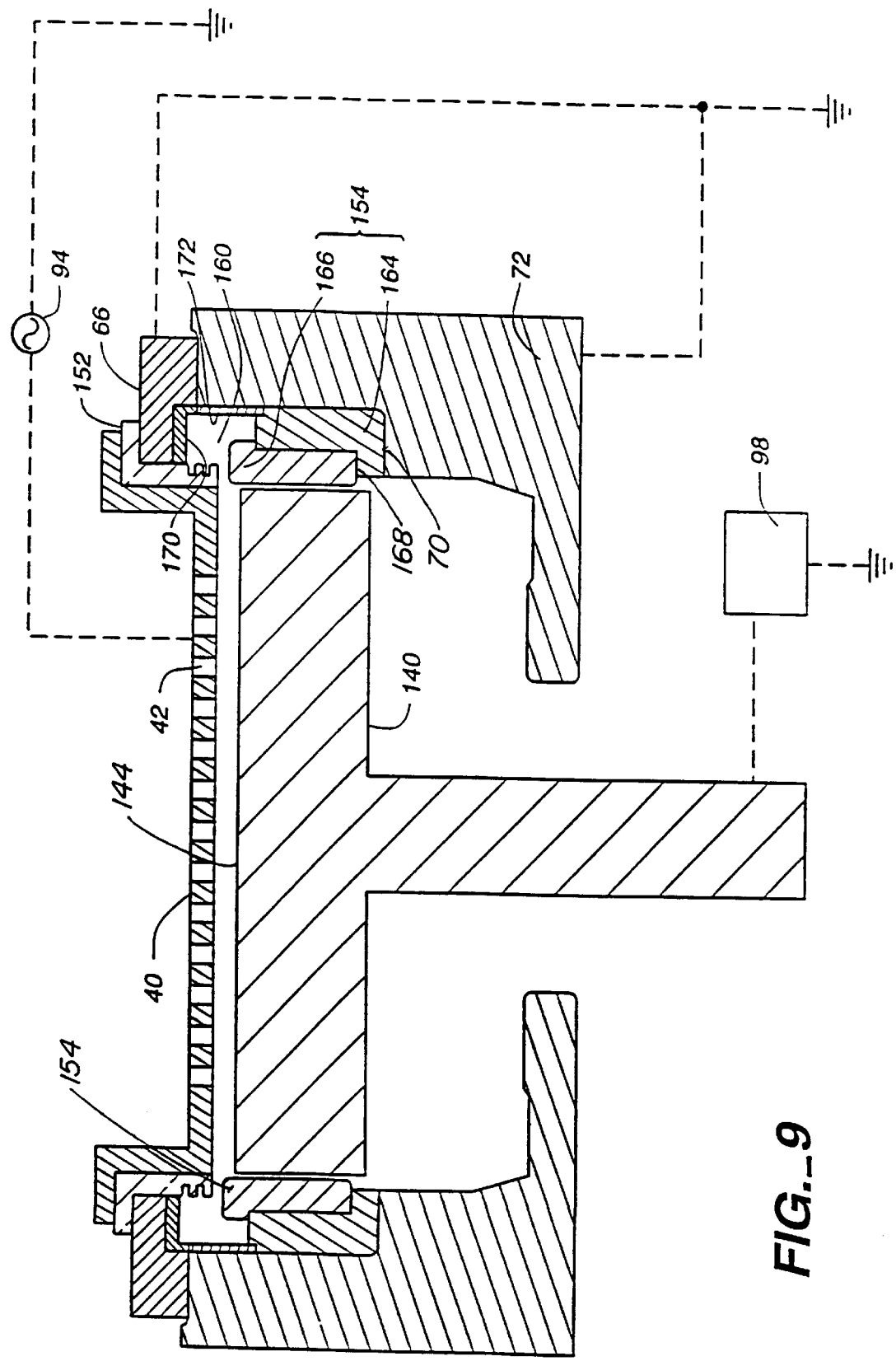
FIG._9

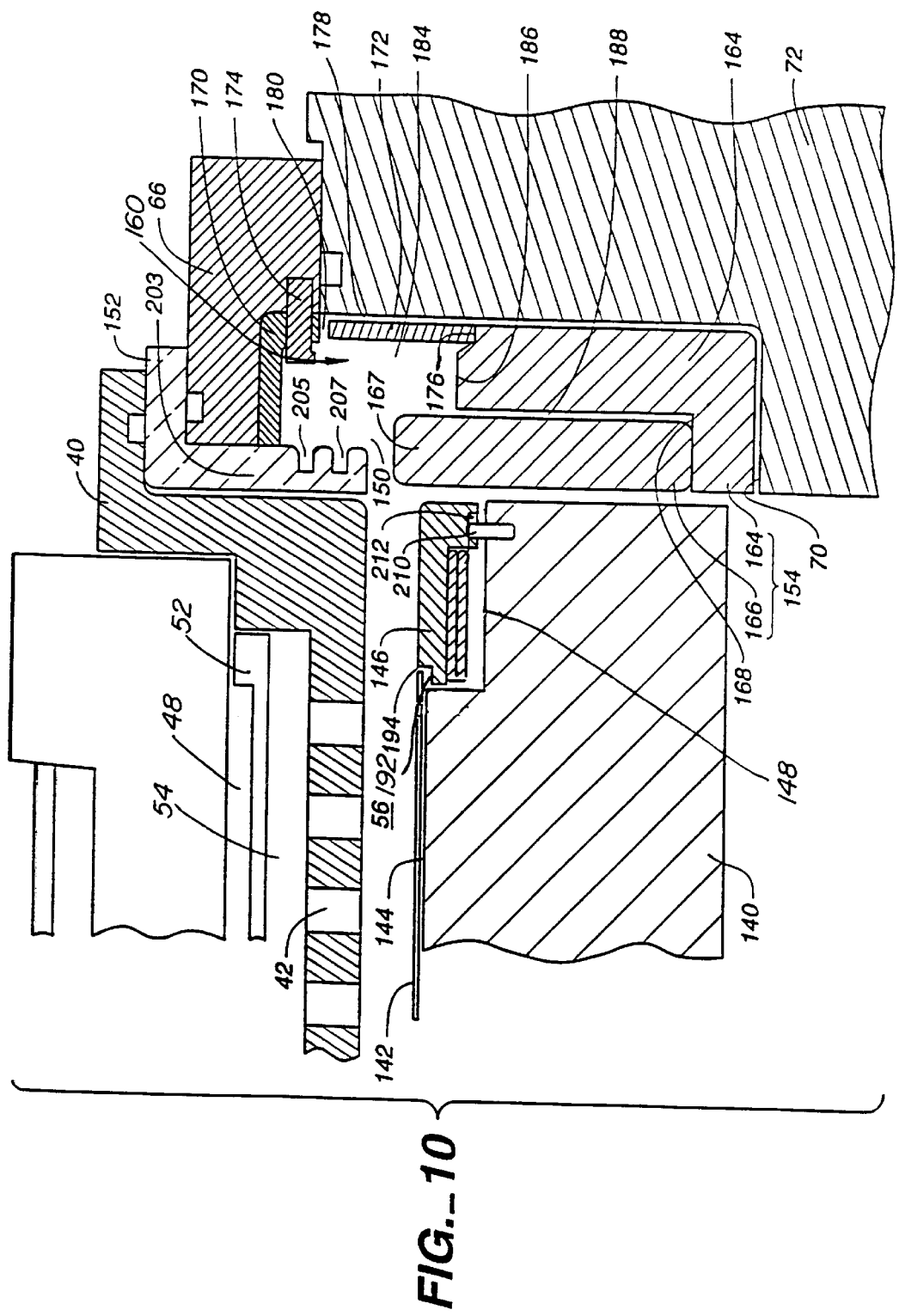

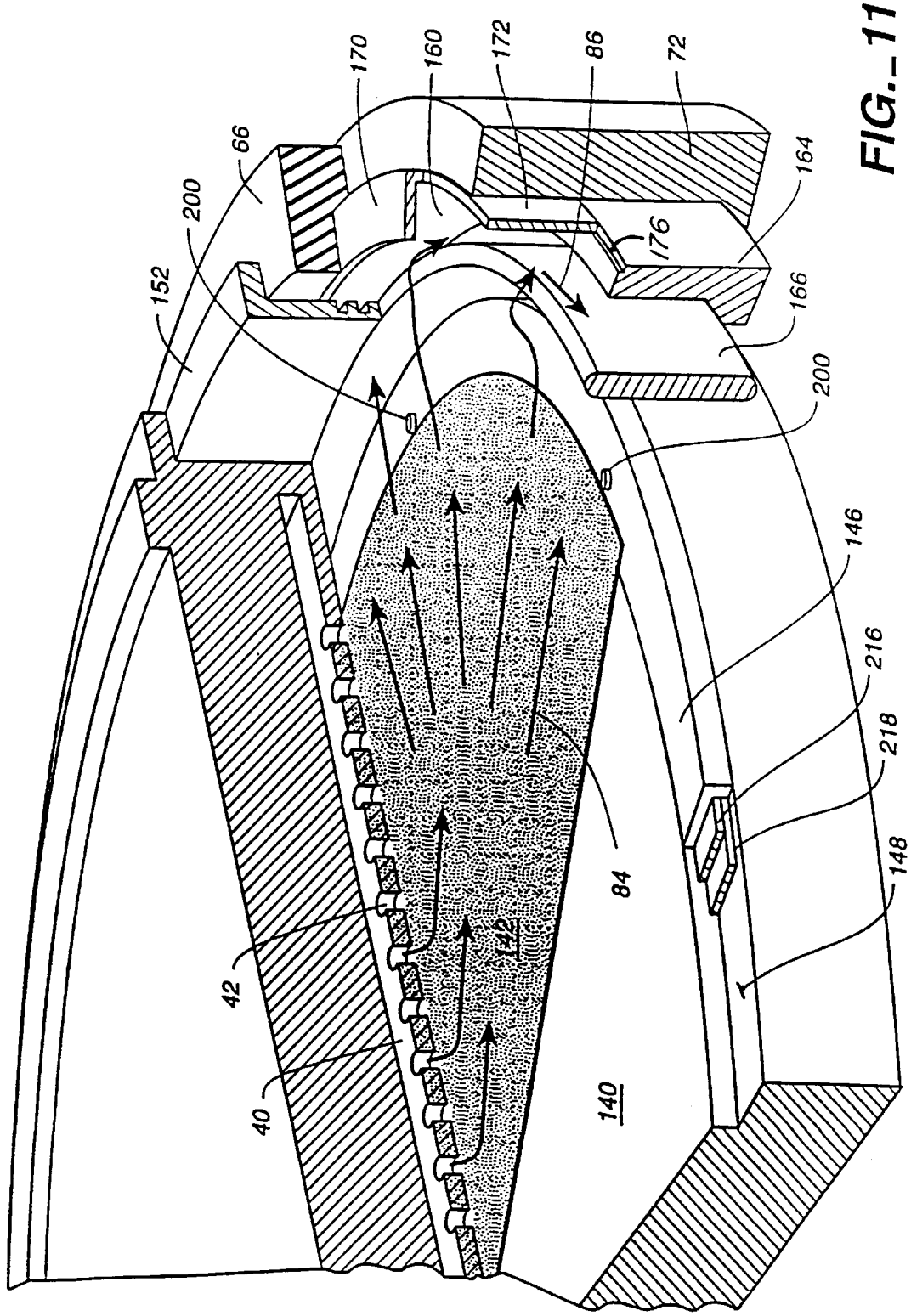

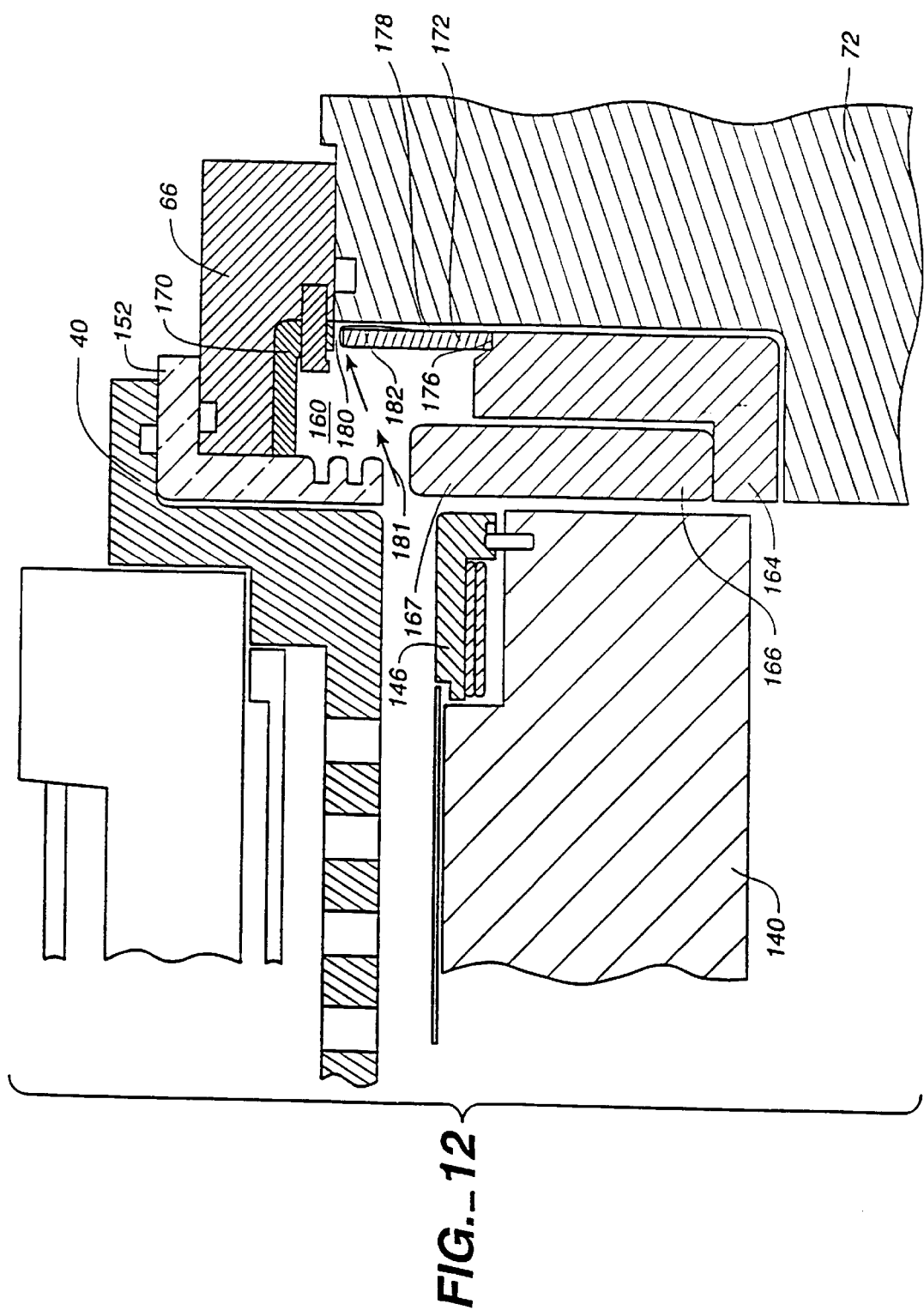

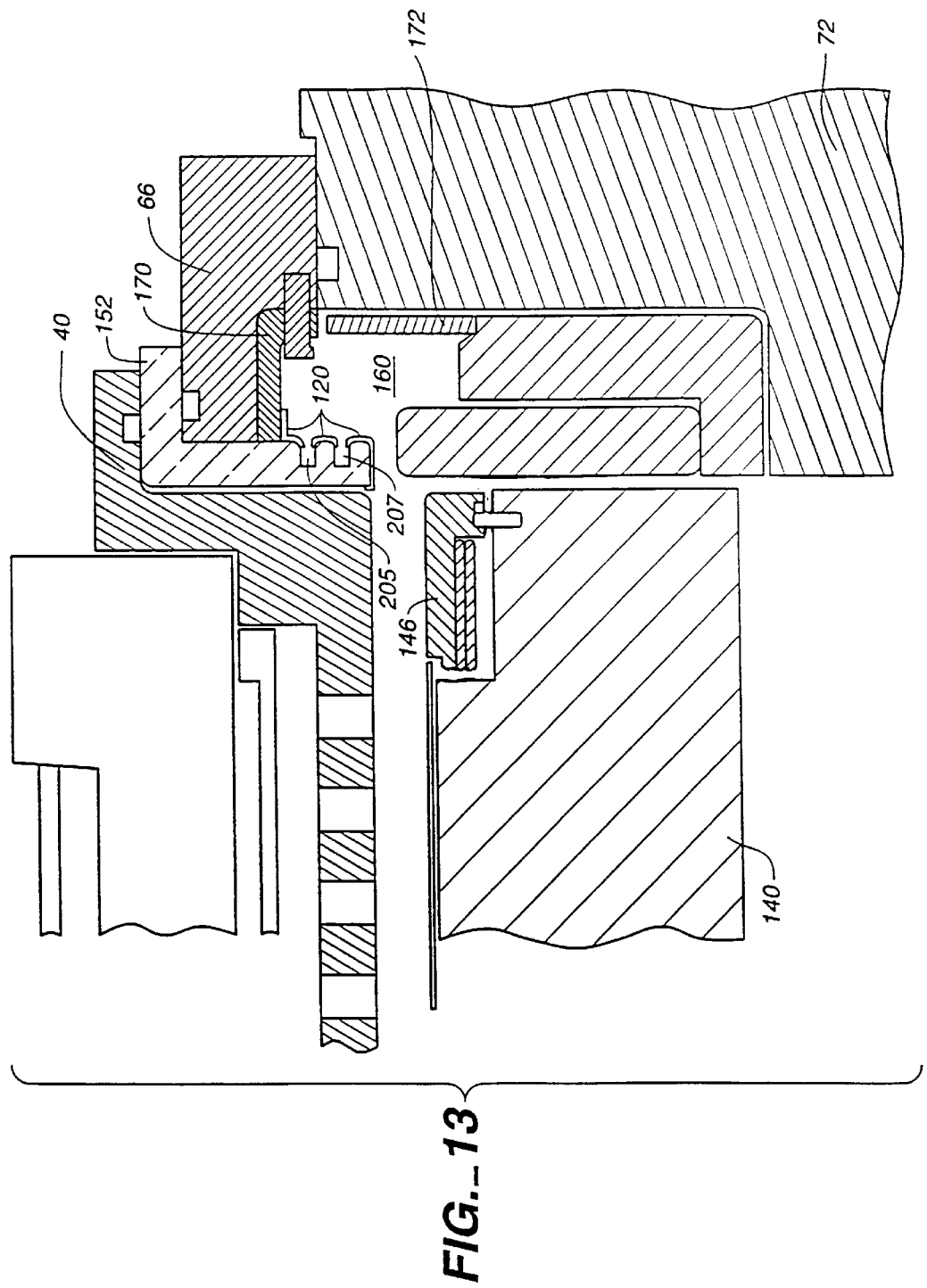

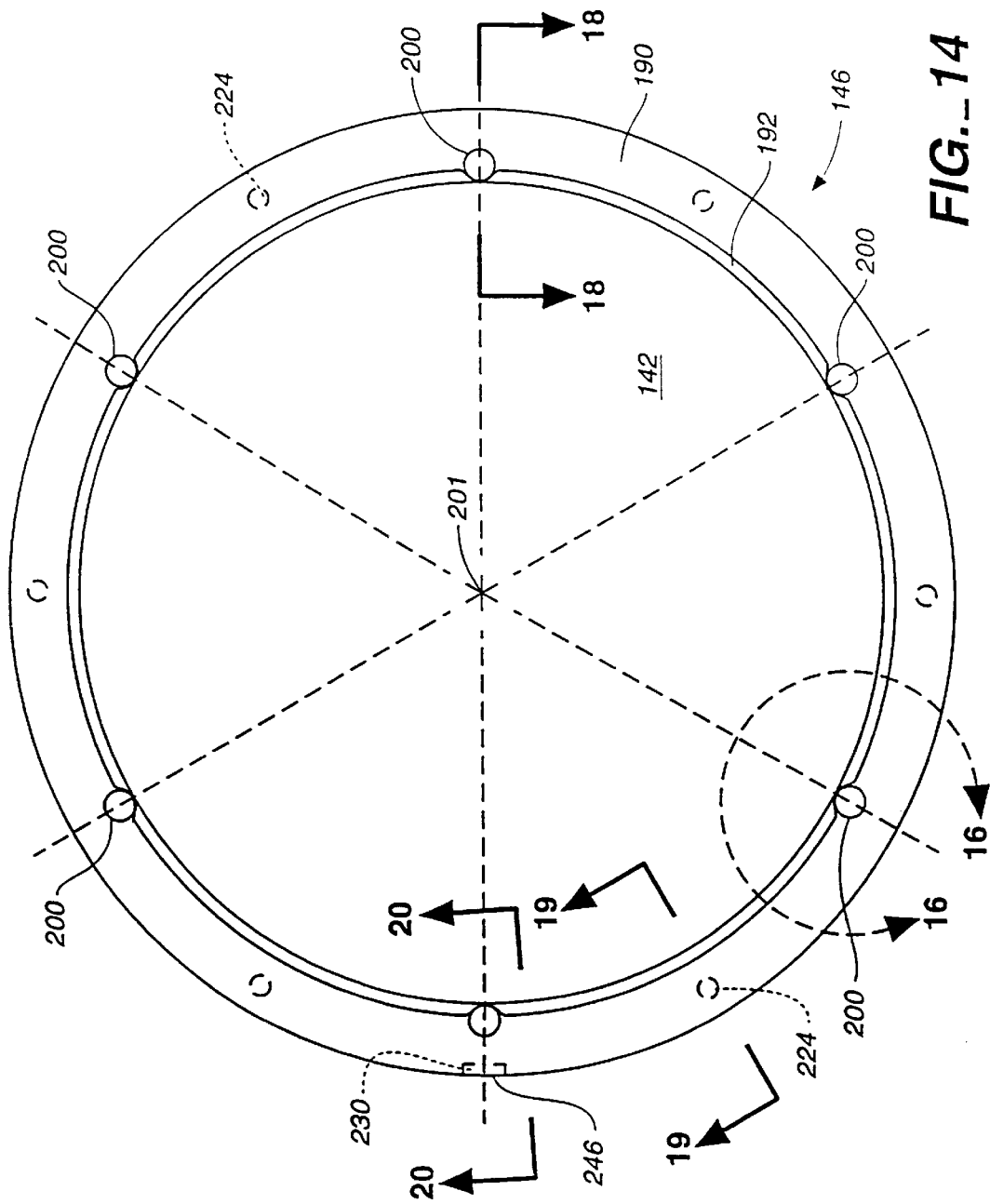

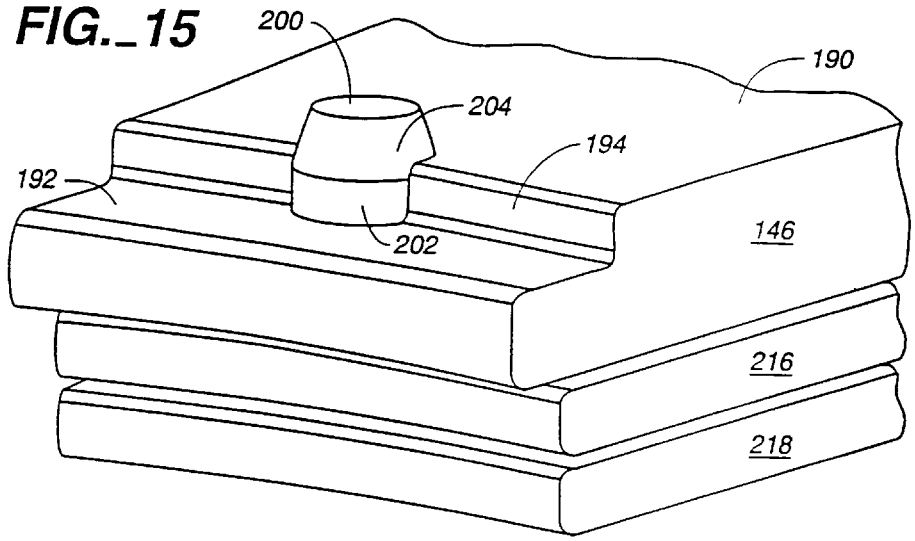
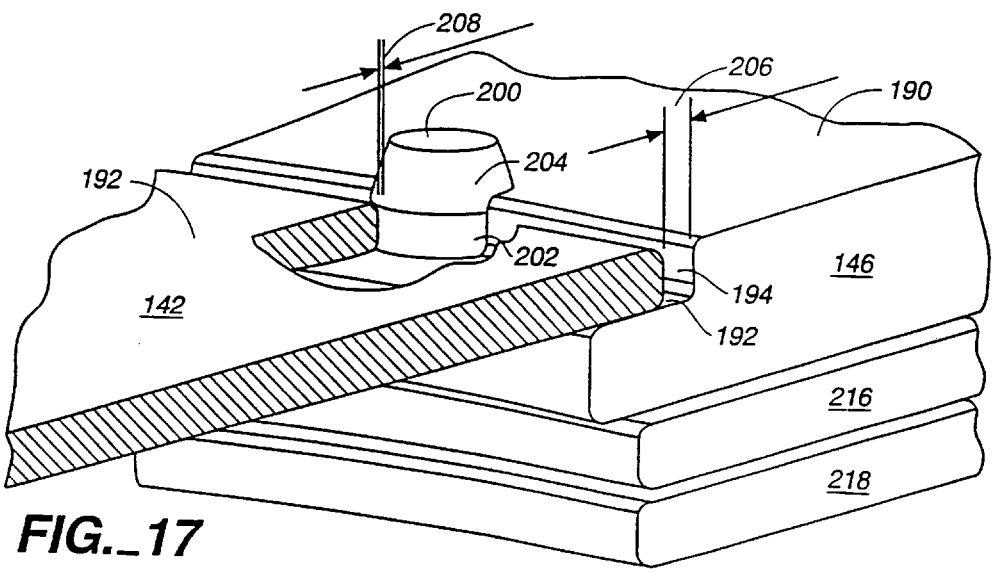

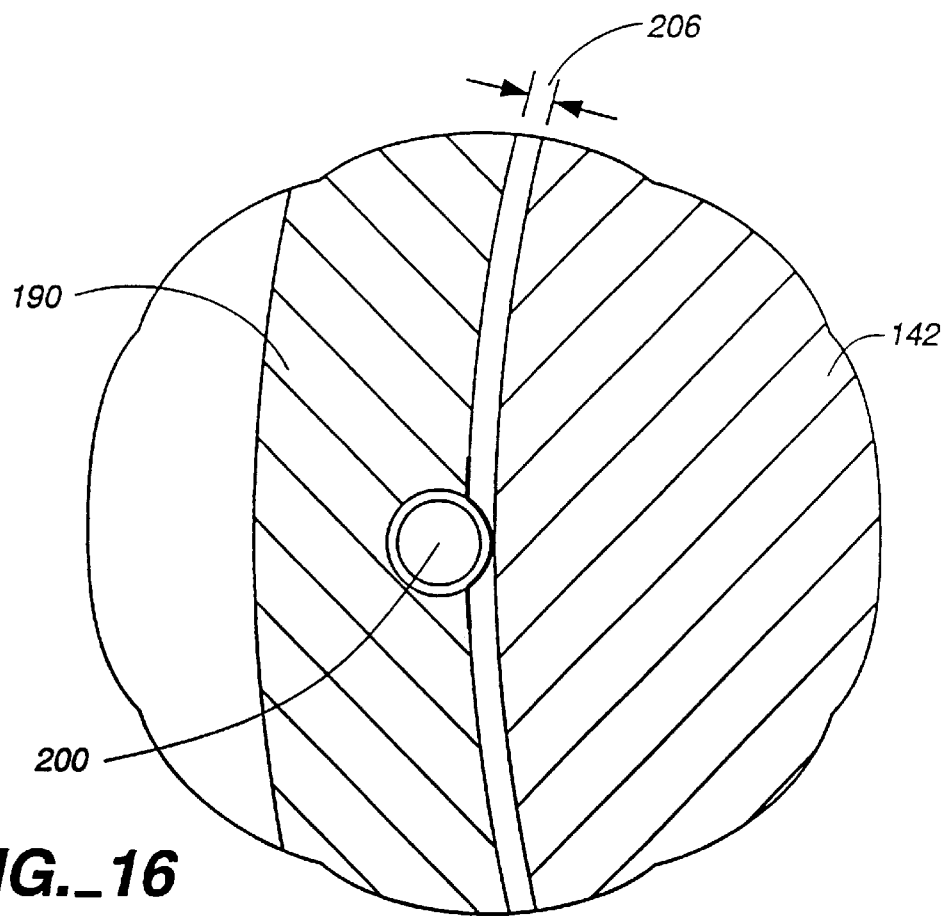
FIG._16

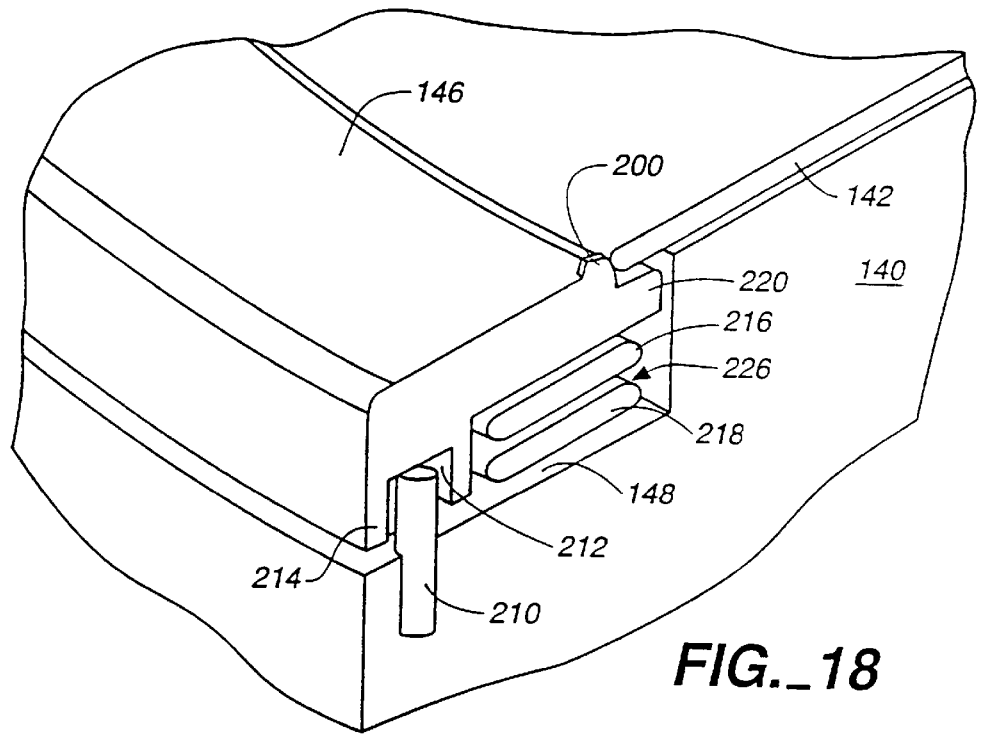
FIG._18
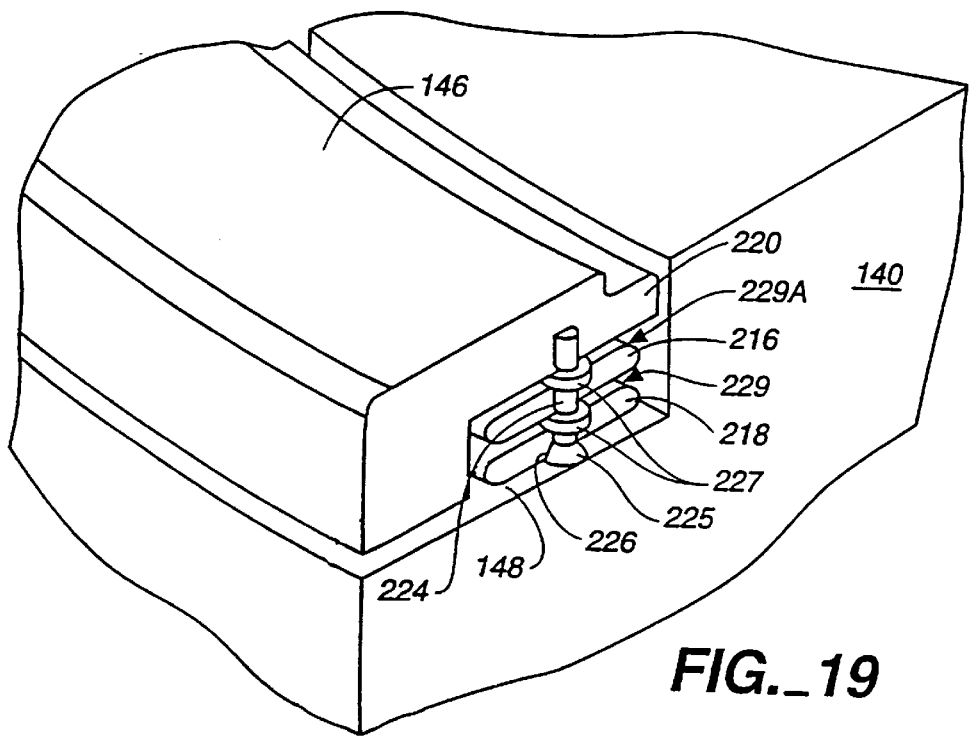
FIG._19

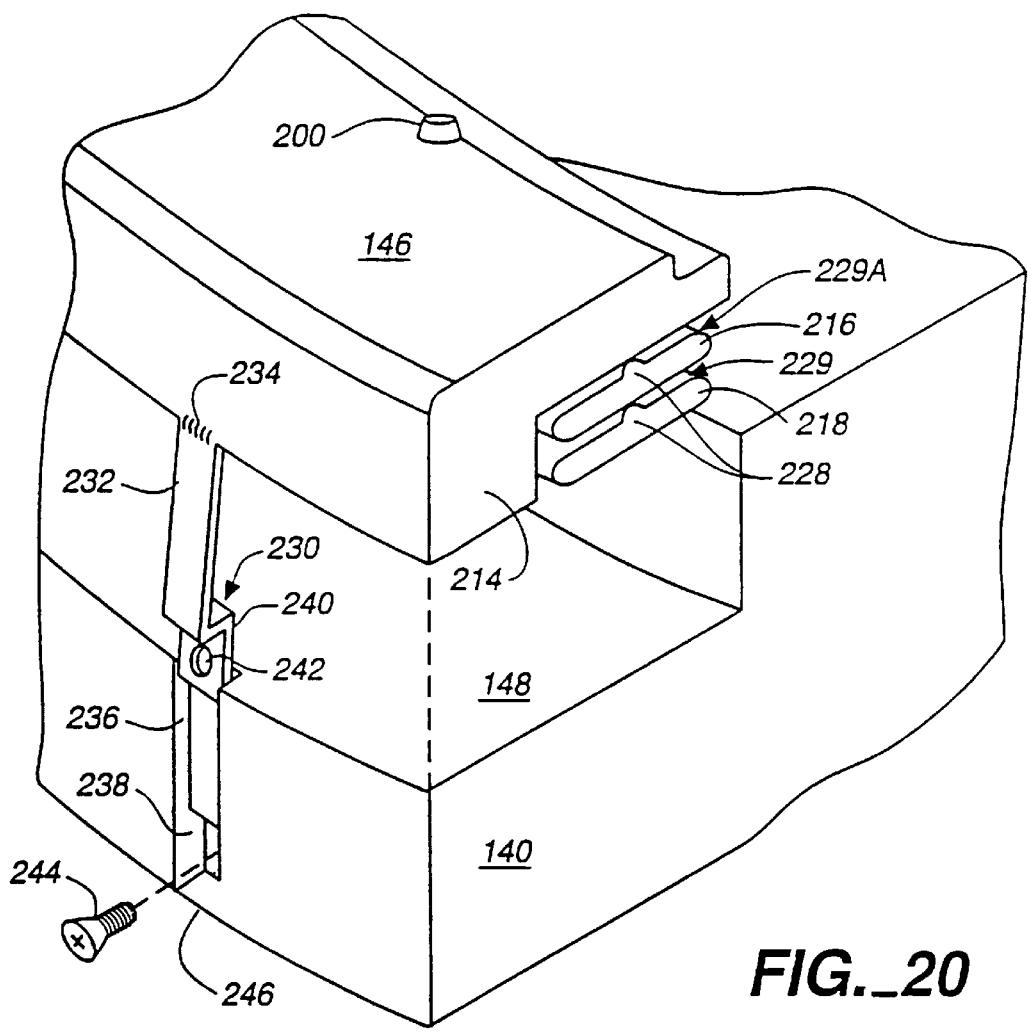
FIG._20

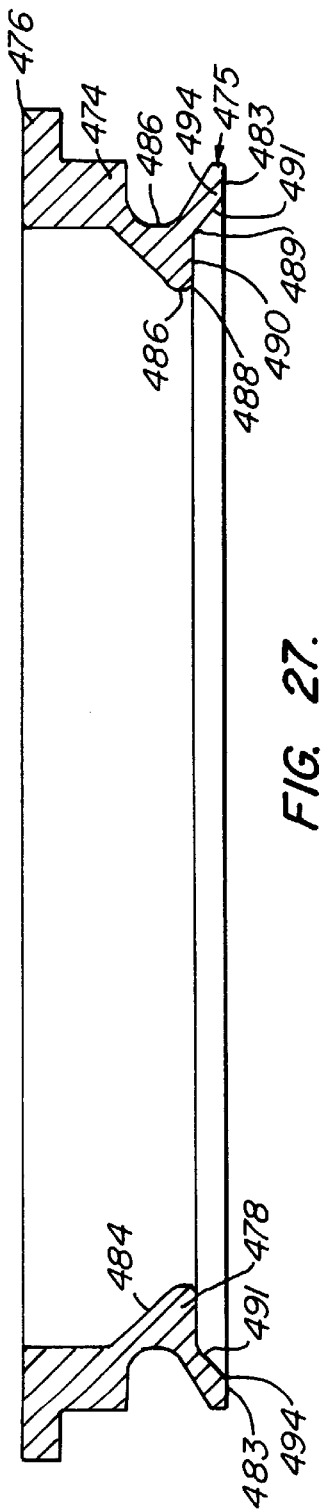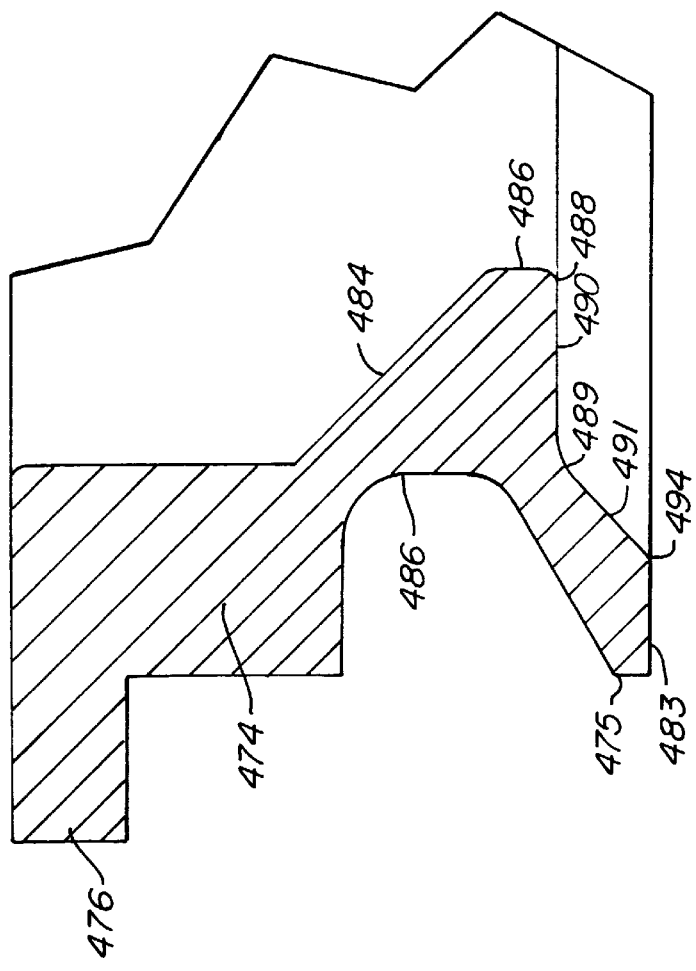
FIG. 27.
FIG. 28.

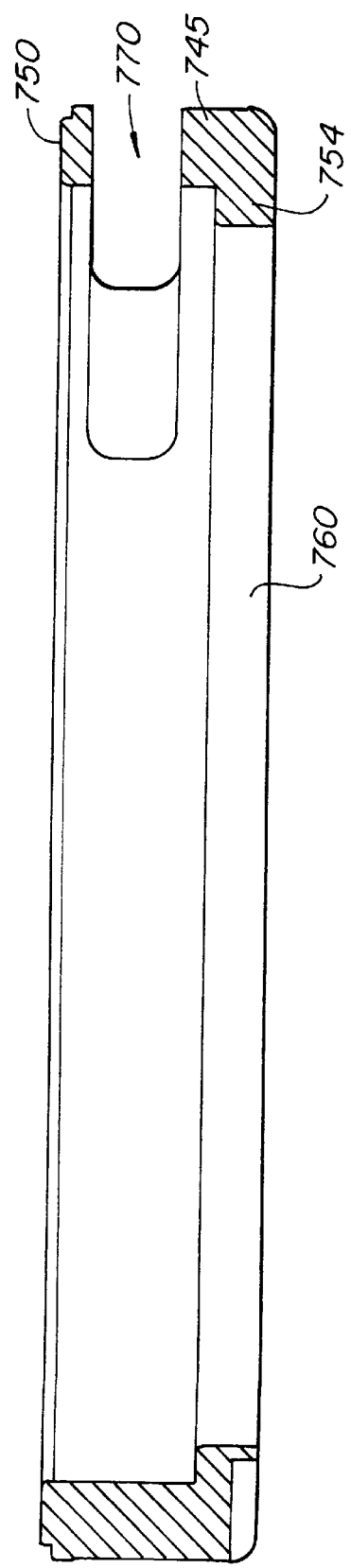

PROCESSING CHAMBER AND METHOD FOR CONFINING PLASMA

CROSS REFERENCE TO RELATED APPLICATIONS

This application is related to pending and commonly assigned patent application entitled "COMPONENTS PERIPHERAL TO THE PEDESTAL IN THE GAS FLOW PULL WITHIN A CHEMICAL VAPOR DEPOSITION CHAMBER," Ser. No. 08/680,724, filed Jul. 12, 1996, having Jun Zhao, Ashok Sinha, Avi Tepman, Mei Chang, Lee Luo, Alex Schreiber, Talex Sajoto, Stefan Wolfe, Charles Dornfest, and Michael Danek listed as co-inventors, the disclosure (including the drawings) of which is hereby fully incorporated herein by reference thereto as if repeated verbatim immediately hereinafter.

BACKGROUND OF THE INVENTION

This application is also related to copending and commonly assigned patent application entitled "METHOD OF REDUCING RESIDUE ACCUMULATION IN CVD CHAMBER USING CERAMIC LINING," Ser. No. 08/577,867, filed Dec. 22, 1995, having Jun Zhao, Tom Cho, Xin S. Guo, Atsushi Tarata, Jianmin Qiao and Alex Schreiber listed as co-investors, the disclosure of which is hereby fully incorporated herein by reference thereto as if repeated verbatim immediately hereinafter. This application is also related to copending and commonly assigned *patent application entitled "A HIGH TEMPERATURE CERAMIC HEATER ASSEMBLY WITH RF CAPABILITY AND RELATED METHOD," Ser. No. 08/800,096, filed Feb. 2, 1997, having Jun Zhao, Charles Domfest, Talex Sajoto, Leonid Selyutin, Stefan Wolff, Lee Luo, Harold Mortensen, and Richard Palicka listed as co-inventors, the disclosure of which is hereby fully incorporated herein by reference thereto as if repeated verbatim immediately hereinafter. Patent application having Ser. No. 08/800,096, filed Feb. 2, 1997, is a continuation-in-part of Ser. No. 08/502,585, filed Jul. 14, 1995, the disclosure of which is hereby incorporated by reference. This application is further also related to copending and commonly assigned patent application entitled "A HIGH TEMPERATURE, HIGH FLOW RATE CHEMICAL VAPOR DEPOSITION APPARATUS AND RELATED METHODS", having Jun Zhao, Lee Luo, Xiao Liang Jin, Jia-Xiang Wang, Talex Sajoto, Stefan Wolff, Leonid Selyutin, and Ashok Sinha listed as co-inventors; and to copending and commonly assigned patent application entitled "A HIGH TEMPERATURE, HIGH DEPOSITION RATE PROCESS AND APPARATUS FOR DEPOSITING TITANIUM LAYERS", having Jun Zhao, Lee Luo, Xiao Liang Jin, Jia-Xiang Wang, and Stefan Wolff listed as co-inventors; and to copending and commonly assigned patent application entitled "APPARATUS FOR CERAMIC PEDESTAL AND METAL SHAFT ASSEMBLY", having Jun Zhao, Talex Sajoto, Leonid Selyutin, Charles Dornfest, Stefan Wolff, Lee Luo, and Eller Juco listed as co-inventors; and to copending and commonly assigned patent application entitled "METHODS AND APPARATUS FOR A CLEANING PROCESS IN A HIGH TEMPERATURE, CORROSIVE, PLASMA ENVIRONMENT", having Jun Zhao, Lee Luo, Jia-Xiang Wang, Xiao Liang Jin, and Stefan Wolff.

BACKGROUND OF THE INVENTION

1. Field of the Invention

This invention is related to semiconductor processing equipment. More specifically this invention provides a processing chamber of a semiconductor processing equipment, and method for confining plasma gas within a processing zone of the processing chamber of the semiconductor processing equipment.

2. Description of the Prior Art

Semiconductor integrated circuits are fabricated with multiple layers, some of them patterned, of semiconductive, insulating, and conductive materials, as well as additional layers providing functions such as bonding, a migration barrier, and an ohmic contact. Thin films of these various materials are deposited or formed in a number of ways, the most important of which in modern processing are physical vapor deposition (PVD), also known as sputtering, and chemical vapor deposition (CVD).

In CVD, a substrate, for example, a silicon wafer, which may already have patterned layers of silicon or other materials formed thereon, is exposed to a precursor gas which reacts at the surface of the substrate and deposits a product of the reaction on the substrate to thereby grow a film thereon. A simple example includes the use of silane ($SiH_4$) to deposit silicon with the hydrogen forming a gaseous byproduct which is evacuated from the chamber. However, the present application is directed more to CVD of a conductive material such as TiN.

This surface reaction can be activated in at least two different ways. In a thermal process, the substrate is heated to a sufficiently high temperature to provide the activation energy for molecules of the precursor gas adjacent to the substrate to react there and deposit a layer upon the substrate. In a plasma-enhanced CVD process (PECVD), the precursor gas is subjected to a sufficiently high field that it forms a plasma. As a result the precursor gas is excited into energetic states, such as ions or radicals, which readily react on the substrate surface to form the desired layered material.

Zhao et al. describe an example of a CVD deposition chamber in U.S. Pat. No. 5,558,717, expressly incorporated herein by reference, and which is assigned to a common assignee. This type of CVD chamber is available commercially from Applied Materials, Inc. of Santa Clara, Calif. as the CVD DxZ chamber. As described in this U.S. Pat. No. 5,558,717 and as illustrated in the cross sectional side view of FIG. 1, a CVD reactor chamber 30 includes a pedestal 32 supporting on a supporting surface 34 a wafer 36 to be deposited by CVD with a layer of material, such as a TiN layer of material. Lift pins 38 are slidable within the pedestal 32 but are kept from falling out by conical heads on their upper ends. The lower ends of then lift pins 38 are engageable with a vertically movable lifting ring 39 and thus can be lifted above the surface 34 of the pedestal 32. With pedestal 32 in a lower loading position (slightly lower than a slit valve identified as "156" below), a robot blade (not shown) in cooperation with the lift pins 38 and the lifting ring 39 transfers the wafer 36 in and out of the chamber 30 through the slit valve, which can be vacuum-sealed to prevent the flow of gas into or out of the chamber through slit valve. Lift pins 38 raise an inserted wafer (not shown) off the robot blade, and then the pedestal 32 rises to transfer the wafer 36 off the lift pins 38 onto the supporting surface 34 of the pedestal 32. A suitable robotics transfer assembly is described in commonly-assigned U.S. Pat. No. 4,951,601, issued to Maydan, the complete disclosure of which is incorporated herein by reference.

Through the use of a self-aligning lift mechanism, the pedestal 32 then further raises the wafer 36 into close opposition to a gas distribution faceplate 40, often referred to as a showerhead, which includes a large number of passageways 42 for jetting the process gas to the opposed wafer 36. The process gas is injected into the reactor 30 through a central gas inlet 44 in a gas-feed cover plate 46 to a first disk-shaped space or void 48 and from thence through passageways 50 in a baffle plate (or a gas blocker plate) 52 to a second disk-shaped space or void 54 in back of the showerhead 40. Showerhead 40 includes a large number of holes or passageways 42 for jetting the process gas into a processing space or zone 56. More specifically, process gas passes from the space or void 54, through the passageways 42 and into the processing space or zone 56 and towards the wafer 36.

As indicated by the arrows, the process gas jets from the holes 42 in the showerhead 40 into the processing space or zone 56 between the showerhead 40 and pedestal 32 so as to react at the surface of the wafer 36. The process gas byproducts subsequently flow radially outwardly across the edge of the wafer 36 and into an annular pumping channel 60 surrounding the upper periphery of the pedestal 32 when pedestal 32 is in the processing position. More particularly, the process gas flows through an annular choke aperture 62 formed between the pumping channel 60 and the processing space or zone 56 over the wafer 36. The choke aperture 62 is more specifically formed between an isolator ring 64 set in a chamber lid rim 66 and an insulating annular chamber insert or shield liner 68 resting on a ledge 70 on the inside of the main chamber body 72. The choke aperture 62 is broadly formed between the main chamber and a removable lid attached to the chamber so that a fully unbroken annular choke aperture 62 can be achieved. The choke aperture 62 has a substantially smaller width than the depth of the processing space or zone 56 between the showerhead 40 and the wafer 36 and is substantially smaller than the minimum lateral dimensions of the circumferential pumping channel 60, for example by at least a factor of five. The width of the choke aperture 62 is made small enough and its length long enough, so as to create sufficient aerodynamic resistance at the operating pressure and gas flow so that the pressure drop across the choke aperture 62 is substantially larger than any pressure drops across the radius if the wafer 36 or around the circumference of the annular pumping channel 60. In practice, it is not untypical that the choke aperture 62 introduces enough aerodynamic impedance that the pressure drop from the middle of the wafer 36 to a point within the pumping channel 60 is no more than 10% of the circumferential pressure drop within the pumping channel 60.

The pumping channel 60 is connected through a constricted exhaust aperture 74 to a pumping plenum 76, and a valve 78 gates the exhaust through an exhaust vent 80 to a vacuum pump 82. The constricted exhaust aperture 74 performs a function similar to that of the choke aperture 62 in introducing an aerodynamic impedance such that the pressure within the pump channel 60 is substantially constant.

The restricted choke and exhaust apertures 62, 74 create a nearly uniform pressure around the circumferential pumping channel 60. The resultant gas distribution flow pattern across the wafer 36 is shown in arrowed lines 84 in FIG. 2. The process gas and its reaction byproducts flow from the center of the showerhead 40 across the wafer 36 and the periphery of the pedestal 32 along radial paths 84 and then through the choke aperture 62 to the pumping channel 60. The gas then flows circumferentially along paths 86 (see FIG. 2) in the pumping channel 60 to the exhaust aperture 74 and then through the exhaust plenum 76 and the exhaust vent 80 to the vacuum pump 82. Because of the restrictions 62, 74, the radial flow 84 across the wafer 36 is nearly uniform in the azimuthal direction.

As shown in FIGS. 1 and 3 (FIG. 3 bring a closeup view of the upper right corner of FIG. 1), the ledge 70 in the chamber body 72 supports the chamber shield liner 68, which forms the bottom of the pumping channel 60. The chamber lid rim 66 forms the top and part of the outside wall of the pumping channel 60 along with part of the chamber body 72. The inside upper edge of the pumping channel 60 is formed by the isolator ring 64, which is made of a ceramic or other electrically insulating material which insulates the metallic showerhead 40 from the chamber body 72.

The CVD reactor 30 of FIG. 1 can be operated in two modes, thermal and plasma-enhanced. In the thermal mode, an electrical power source 90 supplies power to a resistive heater 92 at the top of the pedestal 32 to thereby heat the pedestal 32 and thus the wafer 36 to an elevated temperature sufficient to thermally activate the CVD deposition reaction. In the plasma-enhanced mode, an RF electrical source 94 is passed by a switch 96 to the metallic showerhead 40, which thus acts as an electrode. The showerhead 40 is electrically insulated from the lid rim 66 and the main chamber body 72 by the annular isolator ring 64, typically formed of an electrically non-conductive ceramic. The pedestal 32 is connected to a biasing element 98 associated with the RF source 94 so that RF power is split between the showerhead 40 and the pedestal 32. Sufficient voltage and power is applied by the RF source 94 to cause the process gas in the processing region 56 between the showerhead 40 and the pedestal 32 to discharge and to form a plasma.

The general type of CVD reactor chamber 30 illustrated in FIGS. 1–3 has been used to deposit a film of a conductive material, such as titanium nitride (TiN), using a thermal TDMAT process described by Sandhu et al. in U.S. patent application, Ser. No. 07/898,059, fully incorporated herein by reference thereto. A related plasma process is described by Sandhu et al. in U.S. Pat. No. 5,246,881, fully incorporated herein by reference thereto. The deposition of a conductive material in this chamber has presented some problems that are addressed by this invention.

Titanium nitride is a moderately good electrical conductor, but in semiconductor processing it is used primarily to function as a barrier layer and it assist titanium as a glue layer. This process is often applied to the contact structure illustrated in the cross-sectional view of FIG. 4 in which an oxide layer 100, typically $SiO_2$, is deposited to a thickness of about 1um over a substrate 102 having a surface of crystalline silicon or polysilicon. The oxide layer 100 acts as an inter-level dielectric, but to provide electrical contact between levels, a contact hole 104 is etched through the oxide layer 100 to be filed with a metal such as aluminum. However, in advanced integrated circuits, the contact hole 104 is narrow, often less than 0.35 $\mu$m, and has an aspect ratio of 3 or more. Filling such a hole is difficult, but a somewhat standard process has been developed in which the hole 104 is first conformally coated with a titanium layer 106, and the titanium layer 106 is then conformally coated with a titanium nitride layer 108. Thereafter, an aluminum layer 110 is deposited, usually by physical vapor deposition, to fill the contact hole 104 and to provide electrical interconnection lines on the upper level. The Ti layer 104 provides a glue layer to both the underlying silicon and the oxide on the sidewalls. Also, it can be silicided with the underlying silicon to form an ohmic contact. The TiN layer 106 bonds well to the Ti layer 104, and the aluminum layer 110 wets well to the TiN so that the aluminum can better fill the contact hole 104 without forming an included void. Also, the TiN layer 106 acts as a barrier to prevent the aluminum 110 from migrating into the silicon 102 and affecting its conductivity. In a via structure in which the substrate 102 includes an aluminum surface feature, the Ti layer 104 may not be needed. Even though the electrical conductivities of titanium and titanium nitride are not nearly as high as that of aluminum, they are sufficiently conductive in thin layers to provide a good electrical contact.

Titanium and titanium nitride can be deposited by either CVD or PVD, but CVD enjoys the advantage of more easily forming conformal layers in a hole having a high aspect ratio. The thermal TDMAT process is such a CVD process for conformally coating TiN in a narrow hole.

In the TDMAT process, a precursor gas of tetrakis-dimethylamido-titanium, $Ti(N(CH_4)_2)_4$, is injected into the chamber through the showerhead 40 at a pressure of from about 1 to about 9 Torr while the pedestal 32 holds the substrate 36 at an elevated temperature of about 360° C. or higher, more particularly from about 360° C. to about 450° C. Thereby, a conductive and conformal TiN layer is deposited on the substrate 36 in a CVD process. The TDMAT process is a thermal process not usually relying upon plasma excitation of the precursor gas.

However, it has been found that the TiN layer initially formed by the TDMAT process includes an excessive amount of carbon in the form of included polymers which degrade its conductivity. Thus, the TDMAT deposition is usually followed by a second step of plasma treating the deposited TiN layer. The TDMAT gas in the chamber is replaced by a gas mixture of $H_2$ and $N_2$ in about 50:50 ratio at a pressure of 0.5 to 10 Torr, and the power source 94 is switched ion on to create electric fields between the showerhead 40 and the pedestal 32 sufficient to discharge the $H_2:N_2$ gas to form a plasma. The hydrogen and nitrogen species in the plasma reduce the carbonaceous polymer to volatile byproducts which are exhausted from the system. The plasma treatment thereby removes the carbon to improve the quality of the TiN film.

The plasma treatment process, when performed in the same chamber as the thermal CVD deposition, has demonstrated some problems with uniformity and reproducibility. It is believed that the problems originate from extraneous metal depositions on reactor surfaces affecting the plasma and producing excess particles within the chamber. It is also believed that the depositions occur in two different areas, an area at the top of the pedestal 32 outside of the substrate 36 and an area in and around the pumping channel 60.

A first problem relates to extraneous metal deposition or a buildup 120 on the pedestal 32 because exposed portions of the pedestal 32 are at a temperature equal to and often much greater than that of the wafer 36. More specifically and as shown in the cross-sectional view of FIG. 3, the portion of the pedestal 32 which extends beyond the outside edge of the wafer 36 is subject to the buildup 120 of deposited material which occurs in accordance with the following explanation.

During the thermal phase of the TDMAT process during which the conductive TiN is deposited, the heater 92, shown in FIG. 1, installed in the pedestal 32 heats the pedestal 32 and the heat is transferred thence to the wafer 36. There are several reasons why the exposed portion of the pedestal 32 tends to be at a significantly higher temperature than that of the wafer 36. The showerhead 40 operates at a much lower temperature, typically around 100° C. to readily sink heat from opposed elements. On the other hand, the wafer 36 is incompletely heat sunk on the pedestal 32 and transmits heat conducted to it from the pedestal 32 more poorly that does the directly radiating and more highly thermally conductive pedestal 32. Also, since the chamber is also used for the low-temperature plasma treating phase and additional time is consumed transferring wafers into and out of the chamber, the duty cycle for the high-temperature operation is relatively low and it is necessary to heat the wafer 36 to the required high processing temperatures. To quickly raise the temperature of the wafer 36 to its processing temperature, the temperature of the pedestal 32 is raised to a higher temperature than that of the wafer 36. For all these reasons, the processing temperature of the wafer 36 may be set to 360° C. while the exposed portion of the pedestal tends to be at a significantly higher temperature of 425° C.

Since the rate of deposition on a surface is proportional to the temperature of the surface (the higher the temperature the more rapid the deposition), the higher temperature of the exposed outer edge of the pedestal 32 causes, as illustrated in FIG. 3, a rapid buildup 120 of deposited film. As the thickness of the deposited film increases over the processing cycles of many wafers deleterious effects may occur. The buildup 120 of film thickness at the edge may create an artificial perimeter rim which prevents the wafer 36 from being in full contact with the surface of the pedestal 32, as required for efficient processing. Similarly, once the buildup 120 has developed past some film thickness of the film, successively deposited film layers do not completely adhere to the underlying layers. Portions of the film can then form particles or flakes that separate from the pedestal and float onto the wafer 36 being processed. The particles can create defects on the processed wafer.

A second problem related to extraneous metal deposition arises in that the conductive TiN film is also deposited, to a lesser extent because of lower surface temperatures, on other surfaces exposed to the process gas along its path from the showerhead 40 to and through the pumping channel 60 on its way to the chamber vacuum system 82. FIG. 5 shows an example of the building of a metal film 124 over and around the isolator ring 64 that can cause an electrical short between the electricity biased showerhead 40 and the grounded lid rim 66. FIG. 5 shows only an exaggerated or exploded film buildup 124 on the upper surface of the chamber. In reality, the film builds up on all surfaces, but other buildups are not shown for clarity.

Another example of extraneous film deposition is the buildup of a conductive film 128 (see FIG. 6) over the insulating alumina chamber insert 68 to the point that it extends across the pumping channel 60 and contacts the electrically grounded main chamber body 72. As shown in FIG. 6, this extraneous deposition 128 thus extends the ground potential associated with the chamber body 72 and the lid rim 66 to the inner, upper edge of the insulating annular insert 68 which is closely adjacent the upper peripheral edge of the pedestal 32. The location and quality of plasma in the processing space 56 depends on the distance between the powered plasma source electrodes and surrounding surface and the difference between their respective electrical potentials. When during a long process run, the chamber insert 68 effectively changes from being disposed as a insulator between the chamber body 68 and the plasma to being a grounded conductor, the location and quality of the plasma will be affected, particularly around the edges of the substrate 36. The distortion of the plasma due to the proximity of a closely adjacent electrical ground causes non-uniformity in the plasma, which affects the thickness of the film deposition and its surface properties.

During plasma processing, variations in uniformity of the plasma will affect the surface uniformity of the film produced. Therefore, variations in the intensity of the plasma will affect the uniformity of film properties. The conductivity, which is the inverse of the insulating quality, of the insulating members surrounding the location of the plasma changes as a conductive film is formed on their surfaces and as the conductive film forms a conductive path to adjacent conductive elements at different potentials. This variation in the conductive quality of the ostensibly insulating elements causes variations in the plasma which reduce the process repeatability.

A third problem related to extraneous metal deposition arises in that some electrically floating elements which are exposed to the plasma will accumulate a charge from the plasma. In the instance where these charged pieces are close to a grounded or electrically powered part, there is always a change of arcing between the floating part and a ground or the electrode. In the instance when the wafer is supported on the pedestal, the wafer may act as a floating element which can become charged to cause arcing. Arcing creates particles and defects in the substrate. Therefore, arcing to the wafer should be avoided and the uniformity of the envelope for the plasma treating the surface of the substrate should be held as uniform as possible.

To avoid these potentially deleterious effects, it is common practice to schedule a cleaning or maintenance cycle involving removal and replacement or cleaning of the pedestal before buildup of film can create undesired effects. However, this remedy is disadvantageous. Not only are pedestals expensive, but their replacement or cleaning involves a shut down of expensive equipment and additional operator time.

The buildup of unwanted film thickness on either the perimeter of the susceptor or across insulating members in the chamber requires they be periodically cleaned to prevent short circuiting or unacceptable variations in the plasma treatment. The buildup of a thickness of an unwanted film creates a risk of short circuiting by causing variation in the intensity and locations of the electrical fields exciting the gas to a plasma state. Also, when the risk of conduction or arcing becomes high, a cleaning or maintenance cycle is initiated to restore the original distribution of the electrical field. Other consumable or maintainable components also require replacement or cleaning at certain intervals. Presently the risk of conductance and arcing sets the cleaning/maintenance interval. The mean number of wafers between cleans could be increased dramatically if the problem of film thickness adherence and conductivity across insulating members to grounded members, as described above, could be reduced or eliminated.

A prior art CVD chamber, schematically illustrated in FIG. 7, is similar to that of FIG. 1 except that it is radiantly, not resistively, heated. It has been applied to the deposition of conductive materials and where plasma treatment of one sort or another was performed in the chamber. In this chamber of FIG. 7, an argon treatment sputtering gas was energized into a plasma 130 in a processing space or zone between a pedestal electrode 132 and a counter electrode 134. An RF power source 136 provides RF power to energize the plasma. It was found, however, that, if the plasma 130 was to be well confined in the processing space or zone above the wafer, it was necessary to feed the RF power to a matching network 138 that selectably split the power between the pedestal electrode 132 and the counter electrode 134. It is believed that thus splitting the RF power better confines the plasma because the plasma with a grounded electrode tends to spread outside of the area of the wafer and to be more affected by the extraneously deposited metal layers described above. The matching network 138 allowed the RF power split to the pedestal electrode 132 to be the fraction of 30%, 50% or 70% of the total power. However, it has been discovered that even by selectably splitting the power between the pedestal electrode 132 and the counter electrode 134 does not essentially totally confine the plasma 130 as would be desired. Some of the plasma 130 still escapes beyond the processing space or zone between the pedestal electrode 132 and the counter electrode 134.

Therefore, what is needed and what has been invented is a CVD chamber that does not possess the problems of plasma instability and arching and where the frequency for routine maintenance and cleaning is reduced. More particularly what is needed and what has been invented is a processing chamber of a semiconductor processing equipment, and method for confining plasma gas, especially a plasma gas that produces a TiN layer, within a processing zone of the processing chamber of the semiconductor processing equipment.

SUMMARY OF THE INVENTION

The present invention accomplishes its desired objects by broadly providing systems, methods, and apparatuses for high temperature (at least about 300° C., more typically above about 400° C.) processing of substrates in a plasma-enhanced chemical vapor deposition (PECVD) chamber. Embodiments of the present invention include a PECVD system for depositing a film of titanium nitride from a TDMAT precursor. The present invention broadly provides an apparatus for processing substrates that includes a chamber, a heater pedestal, which supports and heats the substrate, and a plasma system. The heater pedestal can heat the substrate to a temperature of at least about 300° C., preferably above about 400° C. (i.e. from about 400° C. to about 500° C.), in an environment of chlorinated plasma species; and the heater pedestal also includes an RF plane beneath where the substrate sits.

The present invention also accomplishes its desired objects by broadly providing a processing apparatus including a processing chamber for forming films on a substrate. The processing chamber includes a chamber body having a chamber cavity, and a pedestal movably disposed within the chamber cavity of the chamber body. A chamber lid assembly is supported by the chamber body and includes an isolator ring member and a showerhead supported by the isolator ring member. The isolator ring member has an isolator ring lip with a sloping surface communicating with the chamber cavity and extending downwardly and away from the showerhead. The processing chamber further includes a chamber insert assembly supported by the chamber body within the chamber cavity. The chamber insert assembly includes an insert member supported by the chamber body and an inner shield member supported by the insert member. The inner shield member includes an inner shield body having a shield ridge integrally bound thereto and protruding towards the isolator ring lip. The inner shield member additionally comprises a shield lip integrally bound to the shield body for supporting the shield ridge in an integral relationship. The isolator ring member additionally includes a generally planar surface terminating in the sloping surface of the isolator ring lip.

The present invention further accomplishes its desired objects by broadly providing a method for forming a CVD layer on a substrate comprising the steps of:

(a) providing a processing chamber comprising a chamber body, a pedestal movably disposed in the chamber body and including an upper pedestal surface, and a chamber lid assembly supported by the chamber body and including an isolator ring member comprising an isolator ring lip having a sloping surface terminating in a lower lip edge;

(b) disposing a substrate on the pedestal;

(c) elevating the pedestal including the substrate of step (b) until the upper pedestal surface of the pedestal extends above the lower lip edge of the isolator ring lip of the isolator ring member; and (d) processing the substrate including contacting the substrate with a processing gas to form a CVD layer on the substrate.

The CVD layer preferably comprises titanium nitride. Preferably, before the substrate is processed by contacting it with a processing gas, the pedestal is heated to a temperature less than about 600° C., such as from about 400° C. to about 500° C. Preferably further, a plasma is formed with the processing gas.

It is therefore an object of the present invention to provide a processing chamber for forming films on a substrate.

It is another object of the present invention to provide a processing apparatus for forming films on a substrate.

It is also another object of the present invention to provide a method for forming a CVD layer on a substrate.

These, together with the various ancillary objects and features which will become apparent to those skilled in the art as the following description proceeds, are attained by these novel apparatuses and methods, a preferred embodiment thereof being shown with reference to the accompanying drawings, by way of example only, wherein:

BRIEF DESCRIPTION OF THE DRAWINGS

FIG. 1 is a cross-sectional view of a prior-art CVD processing chamber;

FIG. 2 is a horizontal cross-sectional view taken in direction of the arrows and along the plane of line 2—2 in FIG. 1 showing the gas flow distribution across a substrate being processed and the gas flow in the plumbing channel;

FIG. 3 is a schematical closeup view of the upper right-hand corner of the chamber as shown in FIG. 1;

FIG. 4 is a cross-section view of an integrated circuit structure which the apparatus of the invention can be used to make;

FIG. 5 is the upper right-hand corner of the chamber of FIG. 3 having a conductive film formed on the upper surfaces of the chamber;

FIG. 6 is the upper right-hand corner of the chamber having a film deposited in the pumping channel protruding and into the area exposed to plasma in the chambers;

FIG. 7 shows the power splitting energization for prior art TiN chambers;

FIG. 8 is a cross-sectional view of a processing chamber from a copending patent application assigned of the subject patent application;

FIG. 9 is a schematical cross section of the processing chamber of FIG. 8 showing the interrelationship between the electrical potentials of certain structures and emphasizing other features;

FIG. 10 is an enlarged view of the upper right-hand corner of the chamber of FIGS. 8 and 9.

FIG. 11 is a perspective cutaway view of a horizontal cross-section of the processing chamber in FIG. 8 showing the interrelationship of certain structure and features;

FIG. 12 is the enlarged view of the upper right-hand corner of the processing chamber in FIG. 10 showing the buildup of a conductive film around a pumping channel liner;

FIG. 13 is the enlarged view of the upper right-hand corner of the processing chamber in FIG. 10 showing the buildup of a conductive film on the isolator ring as would occur from gas traveling from the gas distribution faceplate to the vacuum evacuation system through the pumping channel;

FIG. 14 is a top plan view of a circular substrate located in a centering ring of a susceptor which is opposite the showerhead or gas distribution plate;

FIG. 15 shows a partially sectioned perspective view of a centering boss as apart of the centering ring;

FIG. 16 shows a closeup plan view of a section of the centering ring with a substrate in position taken at the closeup identified as 16—16 in FIG. 14;

FIG. 17 is similar to FIG. 15 but shows a wafer which has been centered by the boss on the centering ring;

FIG. 18 is a partially sectioned perspective view showing the centering ring, its pin support, and its thermally insulating rings taken at 18—18 in FIG. 14;

FIG. 19 is a partially sectioned perspective view of the centering ring (without the substrate present) showing the fastener for the thermally insulating rings taken at 19—19 in FIG. 14;

FIG. 20 is a partially sectioned exploded perspective view of FIG. 14 taken at 20—20 showing the grounding strap of the centering ring with the centering ring shown separated from the pedestal;

FIG. 27 is a vertical sectional view taken in direction of the arrows and along the plane of line 27—27 in FIG. 26;

FIG. 28 is an exploded view of a sectional end of the isolator ring from FIG. 27;

FIG. 33 is a vertical sectional view taken in direction of the arrows and along the plane of line 33—33 in FIG. 32.

DETAILED DESCRIPTION OF THE INVENTION

Figure 21:
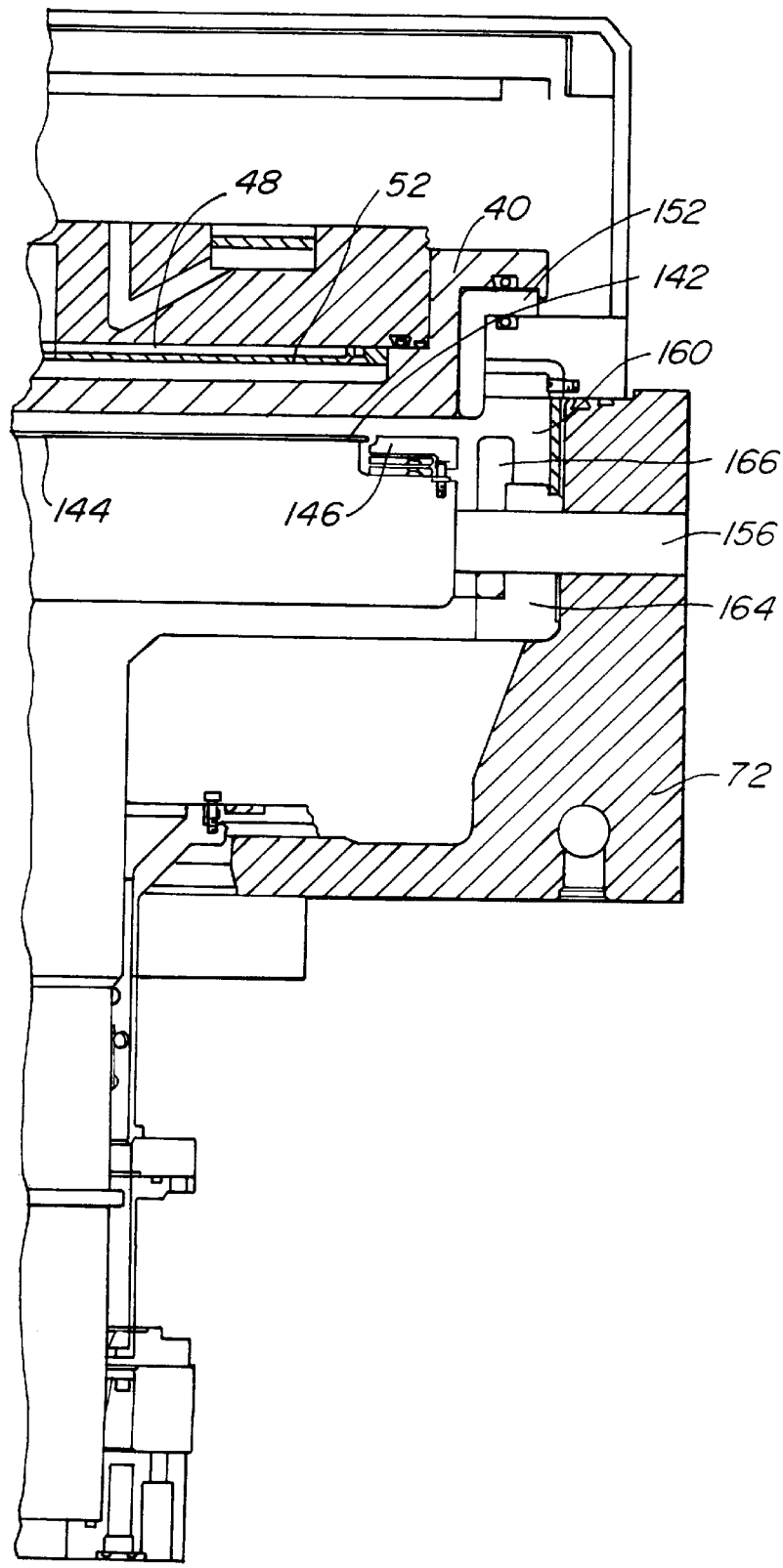
FIG. 21 is partial vertical section view of the processing chamber of FIG. 8 with the pedestal elevated in an operating position such that any plasma between the wafer and showerhead would have a straight, direct and uninterrupted opening into the pumping channel.
Figure 22:
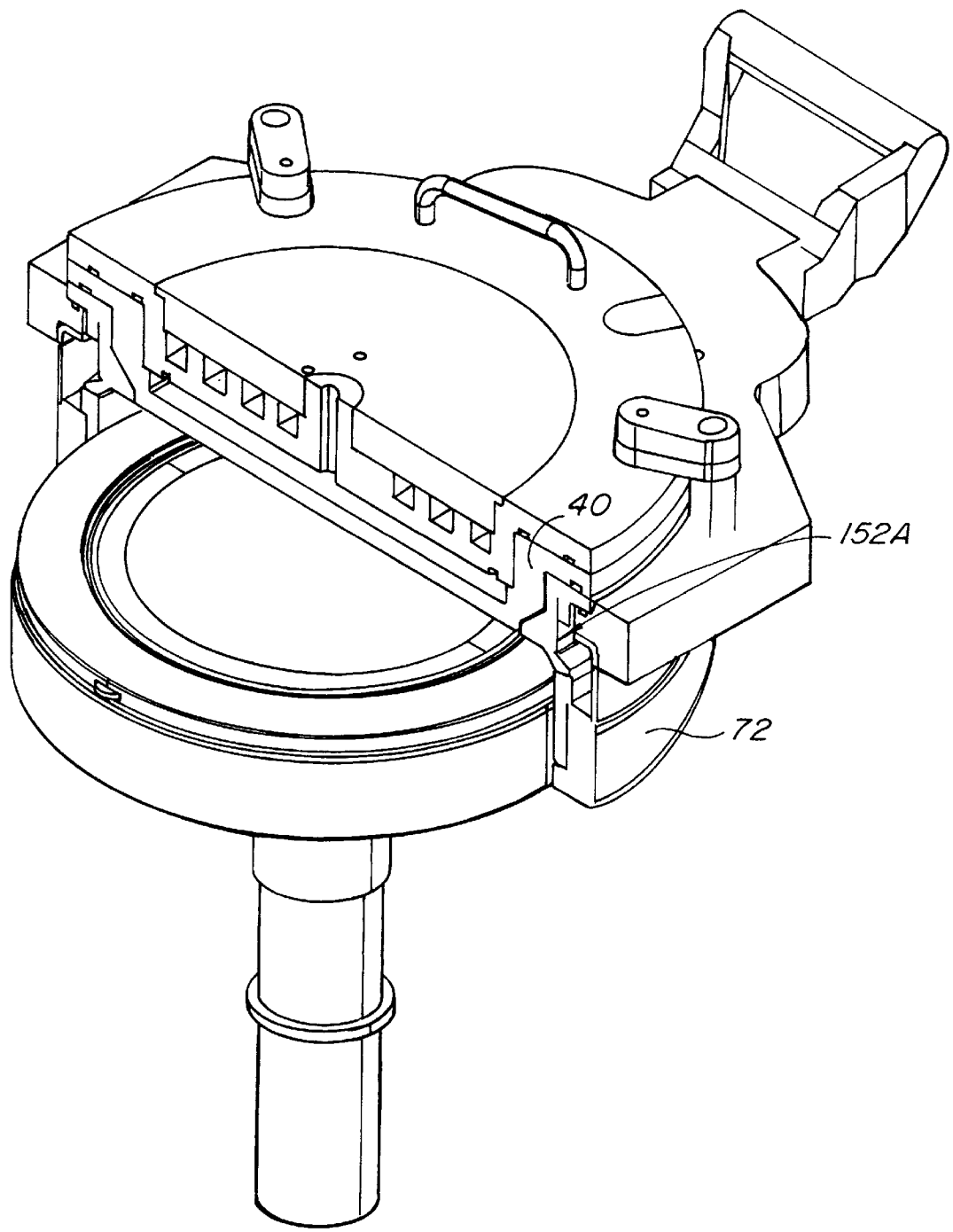
FIG. 22 is a partial perspective view of the CVD processing chamber of the present invention with half of the processing chamber having been removed to expose the improved isolator ring of the present invention.
Figure 23:
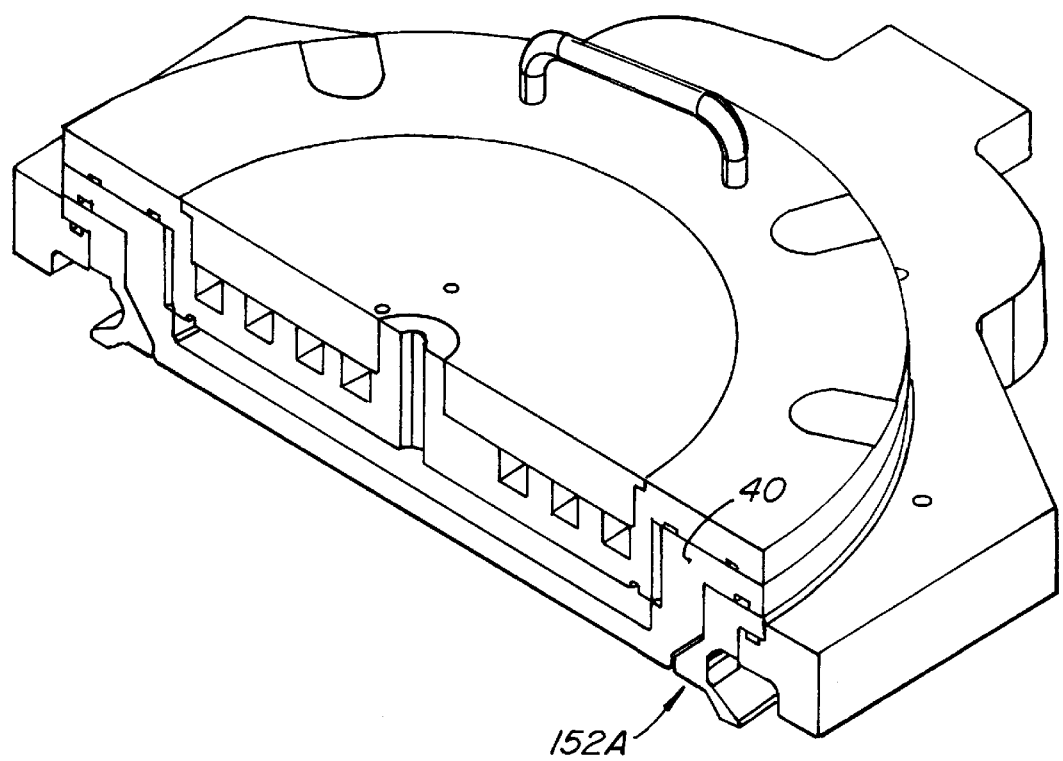
FIG. 23 is a partial perspective view of the lid assembly for the processing chamber of the present invention illustrating the improved isolator ring.
Figure 24:
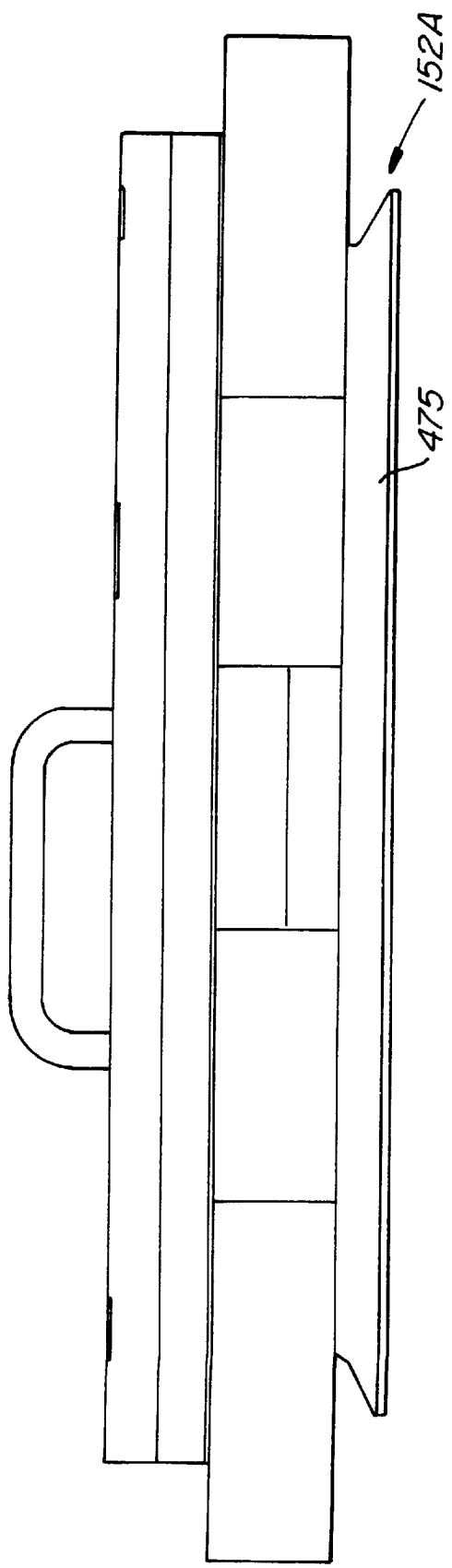
FIG. 24 is a side elevational view of the lid assembly for the processing chamber of the present invention illustrating a part (i.e. the outside surface of the depending lip) of the improved isolator ring extending below a lid plate of the lid assembly.

Referring in detail now of FIGS. 8–20 there is seen a CVD processing chamber comprising a pedestal 140 supporting a wafer 142 on its upper surface 144. Gas entering the process gas inlet 44 is distributed into a first disk-shaped space 48. From the first disk-shaped space 48, process gas passes through passageway 50 in a baffle plate (or gas blocker plate) 52 and into a second disk-shaped space 54. From the second disk-shaped space 54, the process gas passes through holes or passageways 42 of a showerhead 40 and into a processing space or zone 54. The process gas then flows as shown in FIG. 2 radially outwardly with respect to a central axis 141 across an edge of a wafer 142, and across a peripheral centering right 146 (see FIG. 8) which is disposed in an annular ledge 148 recessed in the upper periphery of a pedestal 140. From thence, the process gas flows through a choke aperture 150 formed between the bottom of a modified annular isolator ring 152 and the top of a modified chamber wall insert or shield 154 and into a modified pumping channel 160. The chamber wall insert 154 is shown to have a sealable passageway 156 through it and through the main chamber body 72 for an unillustrated robot blade to transfer wafers into and out of the reactor.

The gas, once it enters the pumping channel 160, is routed around the perimeter of the process chamber, similarly to the prior-art pumping channel 60 as shown in FIGS. 1 and 2, to be evacuated by the vacuum pumping system 82 connected to the process chamber.

The generally illustrated chamber insert 154 includes an L-shaped insulating ceramic ring 164 resting on the inside ledge 70 of the main chamber body 72 and also includes an annular or band shield 166 resting on an inside ledge 168 of the L-shaped ring 164 and spaced from the pedestal 140 and the centering ring 146 by a small gap. Ceramic chamber liners of themselves are well known, for example, as described by Robertson et al. in U.S. Pat. No. 5,366,585 incorporated herein by reference thereto. The band shield 166 is preferably made of a metal, such as aluminum, and extends vertically upwardly substantially above the top of the L-shaped ceramic ring 164 and to a lesser extent above the supporting surface 144 of the pedestal 140.

The annular pumping channel 160 has sides generally defined by the band shield 166, the L-shaped ring 164, liners 170, 172 placed in front of the main chamber body 72 and the lid rim 66, and the isolator 152, with the choke aperture 150 being formed between the isolator ring 152 and the band shield 166. However, the lid liner 170 is placed on the side of the pumping channel 160 facing the lid rim 66 and conforms to its shape. The chamber liner 172 is placed on the side of the pumping channel 160 facing the main chamber body 72. Both liners 170, 172 are preferably made of a metal, such as aluminum, and are bead blasted to increase the adhesion of any film deposited thereon. The lid liner 170 is detachably fixed to the lid rim 66 by a number of pins 174 (see FIG. 10) and is electrically grounded to the lid rim 66. However, the chamber liner 172 is supported on a ledge 176 formed on the outer top of the L-shaped ceramic ring 164 and is precisely formed to have a diameter such that a radial gap 178 (see FIG. 10) is formed between the chamber liner 172 and the main chamber body 72, and an axial gap 180 is formed between the lid and chamber liners 170, 172. This is, the chamber liner 172 is electrically floating.

The band shield 166 and the lid and chamber liners 170, 172 are sized as a set. The band shield 166 is annular and has a major diameter $d_1$ and about the center of pedestal 140. The chamber liner 172 us also annular and in the shape of a band extending axially along the centerline of the pedestal 140 and with a major diameter $d_2$ greater than $d_1$. The lid liner 170 is also annular and has an L-shape with the long, leg extending radially from $d_1$ to $d_2$ and a short leg extending axially at $d_2$.

A partially sectioned, perspective view is given in FIG. 11 of the pedestal 140, the centering ring 146 and the liners 170, 172 and shields 152, 166 surrounding the pumping channel 160. This figure clearly shows the flow of processing gas out of the nozzles 42 of the showerhead 40 towards the wafer 142 and the subsequent radially outward flow 84 over the wafer 142 and then over centering ring 146. Thereafter, the gas flows is deflected upwardly over the top of the band shield 166 into the pumping channel 160, and in the pumping channel 160 it flows along a circumferential path 86 towards the vacuum pump.

As most clearly shown in FIG. 10, the pumping channel 160 and its components are designed to minimize the effect of any deposited conductive film upon the excitation of a plasma in and near the processing space 56. Since the band shield 166 rises above the level of the wafer 142 and of most of the gas flowing over it, a dead space 184 is created in the flow pattern at the bottom of the pumping channel 160 adjacent to a top 186 of the L-shaped ring 164 where it meets the band shield 166. As a result, even though metal may deposit on the upper portion of the band shield 166, the dead space 184 ensures that a significant thickness of metal will not deposit around the backside of the band shield 166, and in particular an insufficient amount of metal will deposit to bridge a gap 188 formed between the band shield 166, even though conducting, remains electrically floating with respect to the pedestal 140 and the main chamber body 72. The band shield 166 has rounded ends 167 to reduce the possibility of arcing.

Referring now to FIG. 12, it is possible for the process gas to flow along a path 181 in the pumping channel 160 through the axial gap 180 at the top of the chamber liner 172 and then deposit a conductive film 182 in the axial gap 180 and in the radial gap 178 on the backside of the chamber liner 172. Since both gaps 178, 180 are dead space, it is unlikely that enough thickness would deposit to bridge either gap 178, 180, and, even if it would, any short across the gap would only ground the chamber liner 172. Another extraneous film in the pumping channel 160 would be required to bring the ground from the main chamber body 72 close enough to the processing space 56 to significantly affect the plasma fields. Very little, if any, gas will progress down to the bottom end of the radial gap 178 where deposition, if it occurs, might create a bridge between the chamber liner 172 and the main chamber body 72. However, because the chamber liner 172 is mounted on an outside ledge 176 of the insulating L-shaped ring 164, a conductive film would have to fill the gap between the L-shaped ring 164 and the main chamber body 72 for the ground of the main chamber body 72 to extend to the band shield 166.

As shown in FIG. 13, an extraneous conductive film 120 deposited on the insulating ceramic isolator ring 152 on surfaces in and near the pumping channel 160 has the potential of extending the grounding plane of the lid rim 66 to the area adjacent to the biased showerhead 40 to significantly perturb the plasma electric fields and perhaps even to short the biased showerhead 40 across the isolator ring 152 to the chamber lid rim 66. However, as shown more clearly in FIG. 10, the L-shaped isolator ring 152 is formed on the outer side of the lower part of its depending inner skirt 203 with two deep annular grooves 205, 207 having widths sufficient to ensure that the deposited film 120 will not bridge the grooves 205, 207 (see FIG. 13). Also, the grooves 205, 207 are deep enough that a dead space occurs at their bottom so that, even though some deposition is inevitable, it does not form a continuous film on the interior surfaces of the grooves 205, 207. In addition, the openings of the grooves 205, 207 into the pumping channel 160 are generally rounded to prevent arcing from any built up conductive film. As exemplary dimensions, the grooves 205, 207 may have a width of 40 to 80 mils (1–2 mm) and a depth of 100 to 175 mils (2.5–4.6 mm) in the case that the isolator ring 152 has a width in its associated inner skirt 203 of 200 to 400 mils (5–10 mm). With this structure, even if the extraneous film 120, as illustrated in FIG. 13, does deposit on the isolator 152, it does not form a continuous conductive film. Thereby, neither is the showerhead 40 shorted out nor is an extraneous grounding plane established adjacent to the showerhead 140.

The lid liner 170, as illustrated in FIG. 10, is metallic and is both thermally and electrically connected to the lid rim 66, effectively forming an extension of it, and because of its remote location does not easily affect the plasma in the processing region 56. Any metal depositing on the lid liner 170 will not further affect the plasma as long as the metal does not extend over the isolator ring 152. In any case, the lid liner 170 is easily removed by means of the fastener 174 (see FIG. 10) when it becomes excessively coated.

The centering ring 146 performs two functions. It acts to precisely center the wafer 142 on the pedestal 140, the wafer 142 having been transferred into the chamber and onto the pedestal 140 by a robot blade (not shown) moving through the access passageway 156 of FIG. 8. This function blends with a retaining function in which the peripheral centering ring 146 acts as a retaining ring to hold the wafer 142 within its opening. Additionally, the centering ring 146 acts as a thermal blanket for the portion of the pedestal 140 exposed outside of the wafer 142. Specifically, its thermal characteristics are designed in view of the intended process so that the centering ring 146 thermally floats relative to the heated pedestal 140 and remains relatively cool compared to the wafer 142 and significantly cooler than the underlying pedestal 140, and thus little material is deposited on it during thermal CVD processing.

Referring now particularly to FIGS. 14–16, the centering ring 146, as illustrated in plan view in FIG. 14 and in a sectioned perspective view in FIG. 15, includes a flat annular upper surface 190, and inside and below this upper surface 190, an annular ledge 192, which is sized so as to closely face the wafer 142 with a thin gap between it and the wafer 142 so as to provide thermal insulation but to nonetheless create a barrier to gas flow. The wafer 142 shown in FIG. 14 is substantially circular, as is the centering ring 146. However, if the wafer 142 is formed with a large alignment flat on one edge, the inside of the centering ring 146 should be shaped to conform to the flat. As shown in FIG. 15, a step wall 194 rises from the ledge 192 to the flat upper surface 190 of the centering ring 146. The height of the step wall 194 equals or is somewhat more than the thickness of the wafer 142 so that the top surface of the wafer 142 is supported on or cantilevered slightly above the surface of the ledge 192 is even with the upper surface 190 of the centering ring.

A series of six centering bosses 200, also shown in expanded plan view of FIG. 16, is equally distributed at 60° intervals about the centering ring 146 with respect to a center 201 of the pedestal 140 to which the centering ring 146 is also concentric. The centering bosses 200 rise from the ledge 192 but only partially protrude from the step wall 194. The bosses 200 include a cylindrical base 202 (see FIG. 15) and a truncated cone 204 above it, with a separation line or edge 203 separating the cylindrical base 202 from the truncated cone 204. The separation line or edge 203 is somewhat below the planar upper surface 190 of the centering ring 146 so that the truncated cone 204 projects above the planar upper surface 190. Even though the centering boss 200 is defined in these simple geometric terms, both the convex and concave corners of the boss 200 are smoothed to reduce any arcing or chipping of the wafer. Related centering pins, though mounted in the pedestal, have been disclosed by Lei et al. in U.S. Pat. No. 5,516,367, incorporated herein by reference thereto.

The centering ring 146 is supported on the pedestal 140 as was previously indicated. When the robot blade (not shown) transfers a wafer 142 into the chamber, both the pedestal 140 and the lift ring 39 of FIGS. 1 and 8 are lowered out of the way. The lift ring 39 then rises to raise the lift pins 38 out of the pedestal 140 to a sufficient height that their conical heads slightly lift the wafer 142 off the robot blade. The robot blade is then withdrawn, and the pedestal 140 and attached centering ring 146 are raised so that the lift pins 38 supporting the wafer 142 effectively retract toward the supporting surface 144 of the pedestal 140.

However, if the wafer 142 is not precisely centered with respect to the pedestal center 201, as it approaches the pedestal 140 it will first encounter one or two of the centering bosses 200 on their conical tops 204. The tapered surfaces of the conical tops 204 will exert sufficient lateral force on the wafer 142 that it will slide towards the center 201 of the pedestal 140, thus centering the wafer 142. The wafer 142, upon being further lowered relative to the pedestal 140 will be located, as illustrated in the partially sectioned perspective view of FIG. 17, in a centered position inside the cylindrical bases 202 of all the centering bosses 200.

The wafer 142 is thermally isolated from the centering ring 146 as much as possible. Because the cylindrical bases 202 of the bosses 200 only partially protrude into the area of the ledge 192, a gap 206, shown in FIGS. 16 and 17, is formed between the beveled edge of the wafer 142 and the step wall 194 of the centering ring 146. Also, the locus of the extreme radially inward positions of the cylindrical bases 202 of the bosses 200 is sized to be slightly larger than the diameter of the wafer 142, such that a thin gap 208 is designed to exist between the wafer edge and the cylindrical boss base 202 so as to minimize conductive heat transfer.

The wafer 142 during CVD processing is gravitationally supported on the pedestal 140, but the height of the upper surface of the ledge 192 of the centering ring 146 is tightly controlled so that it is slightly below the effective supporting surface 144 of the pedestal 140 and the wafer edge is cantilevered over the upper surface of the ledge 192 with a thin gap between (see FIG. 10). The gap between the wafer edge and the ledge 192 is large enough at the operational deposition pressures to provide good thermal isolation, but is small enough and long enough to present sufficient aerodynamic resistance to prevent flow of deposition gas to the backside of the wafer. Also, the gap is thin enough to prevent a plasma from entering the gap and producing arcing.

Thermal isolation of the centering ring 146 from the pedestal 140 is achieved in two ways. The centering ring 146 is preferably composed of aluminum or nickel-coated stainless steel. As best shown in the perspective view of FIG. 18, the centering ring 146 is supported above the peripheral ledge 148 of the pedestal 140 by three evenly spaced support pins 210 fixed into the ledge 148 of the pedestal 140 and projecting upwardly therefrom by a precise height. The support pins 210 effectively present point contacts between the pedestal 140 and the centering ring 146 because of their very small cross section compared to the area of the centering ring 146. The support pins 210 are preferably made of ceramic or a metal having a low thermal conductivity, such as stainless steel. Both the small size of the support pins 210 and their low thermal conductivity minimize the conduction of heat between the pedestal 140 and the centering ring 146. The support pins 210 fit into respective radial slots 212 extending from a bottom of an outer annular base 214 of the centering ring 146 and support the centering ring 146 at a precisely set height above the ledge 148 of the pedestal 140. The radially elongated shape of the slots 212 allows for differential thermal expansion between the centering ring 146 and the pedestal 140.

Radiative and convective thermal transfer between the bottom of the centering ring 142 and the pedestal is minimized by a stack of thermally insulating rings 216, 218 spaced between a bottom surface of an inwardly projecting rim 220 (see FIG. 18) of the centering ring 146 and the ledge 148 of the pedestal 140. The thermally insulating rings 216, 218 are preferably formed of ceramic or other material of low thermal conductivity, such as stainless steel, to reduce the conductive transfer of heat therethrough.

As illustrated in the cutaway perspective view of FIG. 19, the thermally insulating rings 216, 218 are fixed to the bottom of the projecting rim 220 if the centering ring 146 by a series of fasteners 224, such as screws or rivets, arranged on the centering ring 146, as shown in the plan view of FIG. 14. The fasteners 224 are positioned so that gaps are formed between the pair of rings 216, 218 and both the outer annular base 214 of the centering ring 146 and the ledge 148 of the pedestal 140. Conical heads 225 (see FIG. 19) of the screw fasteners 224 are recessed in counter sinks 226 at the bottom of the bottom ring 218 so as to present a smooth surface. The two rings 216, 218 are separated from each other and from the projecting rim 220 of the centering ring 146 by either thermally insulating spacers 227 or by spacing bumps 228, shown in FIG. 20, to form a gap 229 between the rings 216, 218 as well as a gap 229A between the ring 216 and the projecting rim 200 of the centering ring 146. These various gaps further cause the rings 216, 218 to thermally float so as to more effectively thermally separate the centering ring 146 from the pedestal 140. Two such rings have been shown to reduce the radiative thermal transfer by 65%; three rings, by 75%.

These different thermal isolation means have been tested in a prototype reactor during normal CVD processing of the type described before. In these tests, the temperature of the pedestal 140 was measured to be 430° C., the temperature of the wafer 142 to be 360° C., but the temperature of the centering ring 146 to be only 290° C. At 360° C., satisfactory thermal deposition of TiN is achieved on the wafer 142, but at 290° C. little or none of the same material deposits on the centering ring 146. These temperature differentials are driven by a showerhead 46 that remains at about 100° C. as well as by other thermal leakages to the side.

The many means used to thermally isolate the centering ring 146 also tend to electrically isolate it. As a result, it tends to become electrically charged in the presence of a plasma in the processing space or zone 56. Such electrical charging needs to be avoided because it can produce arcing between the centering ring 146 and the wafer 142, causing direct damage to the wafer. Arcing to any other point produces particles which are apt to settle on the wafer and produce defects. Thus, it is desired that the centering ring 146 and the pedestal 142 be held to the same electrical potential.

One structure to fix the potential of the centering ring 146 to that of pedestal 140 is a thin, solid, flexible grounding strap 230 illustrated in the cutaway perspective view of FIG. 20. The grounding strap 230 is composed of a thin tab 232 of an electrically conductive and mechanically soft metal, such as aluminum, which is permanently joined to the base 214 of the centering ring 146 by a weld 234. The thickness of the metal tab 232 is thin enough so that it conducts little heat and does not mechanically support per se the centering ring 146.

The pedestal 140 is formed on its periphery with a shallow, axially extending slot 236 with a deeper slot section 238 being formed at its bottom. The tab 232 is bent at its bottom into a Z-shaped section 240 such that the upper part of the tab 232 fits into the shallow slot 236 and the Z-shaped section 240 fits into the deeper slot section 238. A hole 242 formed in the very bottom of the tab 232 passes a screw 244, which is then threaded into a corresponding hole in the pedestal 140 within the deeper slot section 238, thus completing the electrical grounding. The shallow slot 236 encompasses both the tab 232 and the head of the screw 244 so as to maintain a nominal perimeter outline 246 of the pedestal 140. Also, the shallow slot 236 and the ground strap 230 are configured such that any differential motion due to temperature differences between the pedestal 140 and the centering ring 146 are accommodated without interference between the pieces while electrical continuity is maintained between the centering ring 146 and the pedestal 140.

Referring in detail now to FIGS. 22–33 for another embodiment of the present invention, there is seen the CVD apparatus 10 having another embodiment for the processing chamber 30. In this embodiment for the present invention, the processing chamber 30 includes another embodiment for the isolator 152A, and the chamber wall insert assembly 154, including the shield 166 and the ceramic ring 164.

Figure 25:
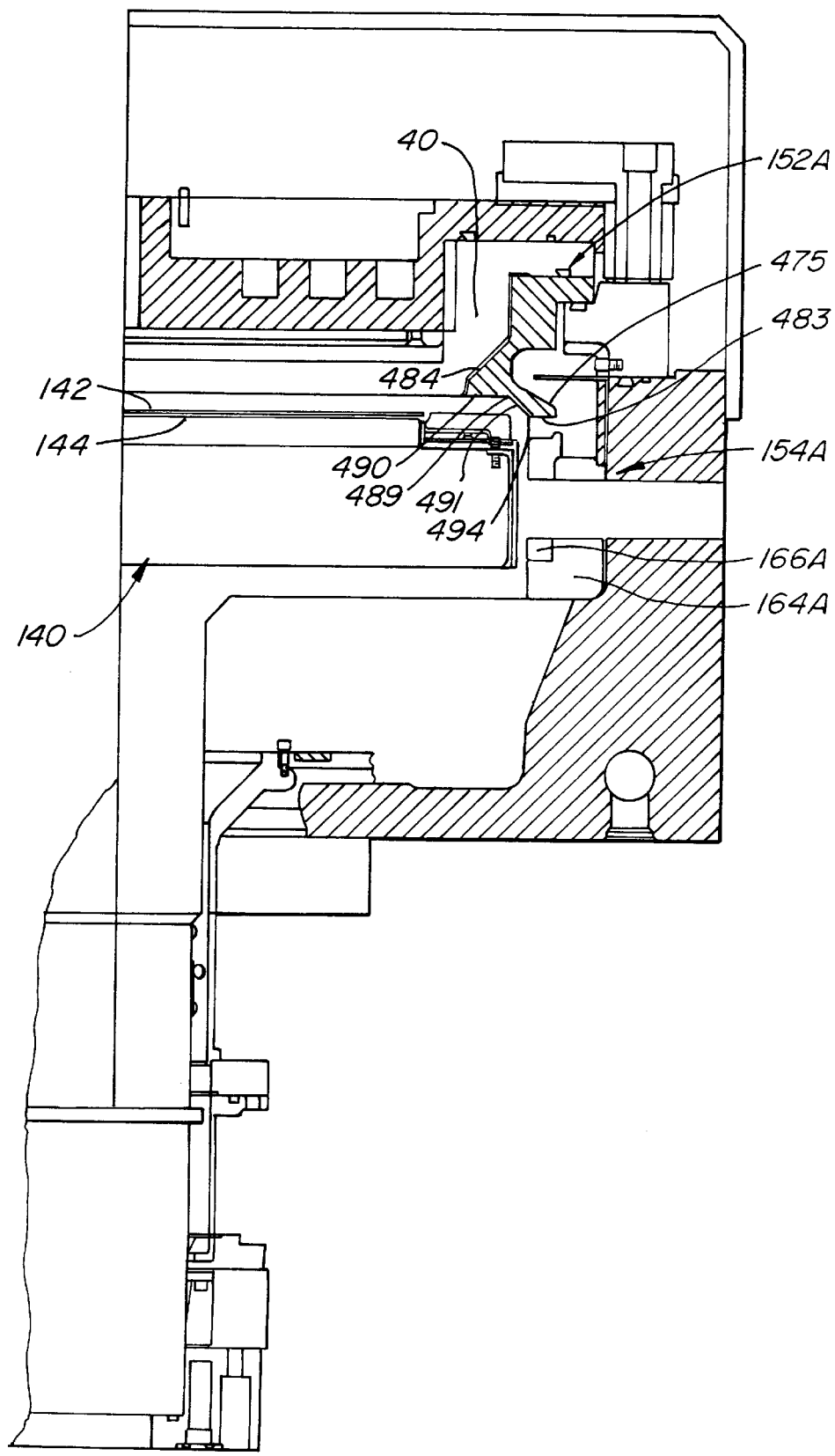
FIG. 25 is a partial vertical sectional view of the processing chamber of the present invention with the pedestal supporting a wafer in an elevated operating position and with the depending lip of the improved isolator ring extending below the wafer such that any plasma between the wafer and the showerhead would be confmed within the processing space or zone therebetween and the plasma would not have a straight and direct opening into the pumping channel.
Figure 26:
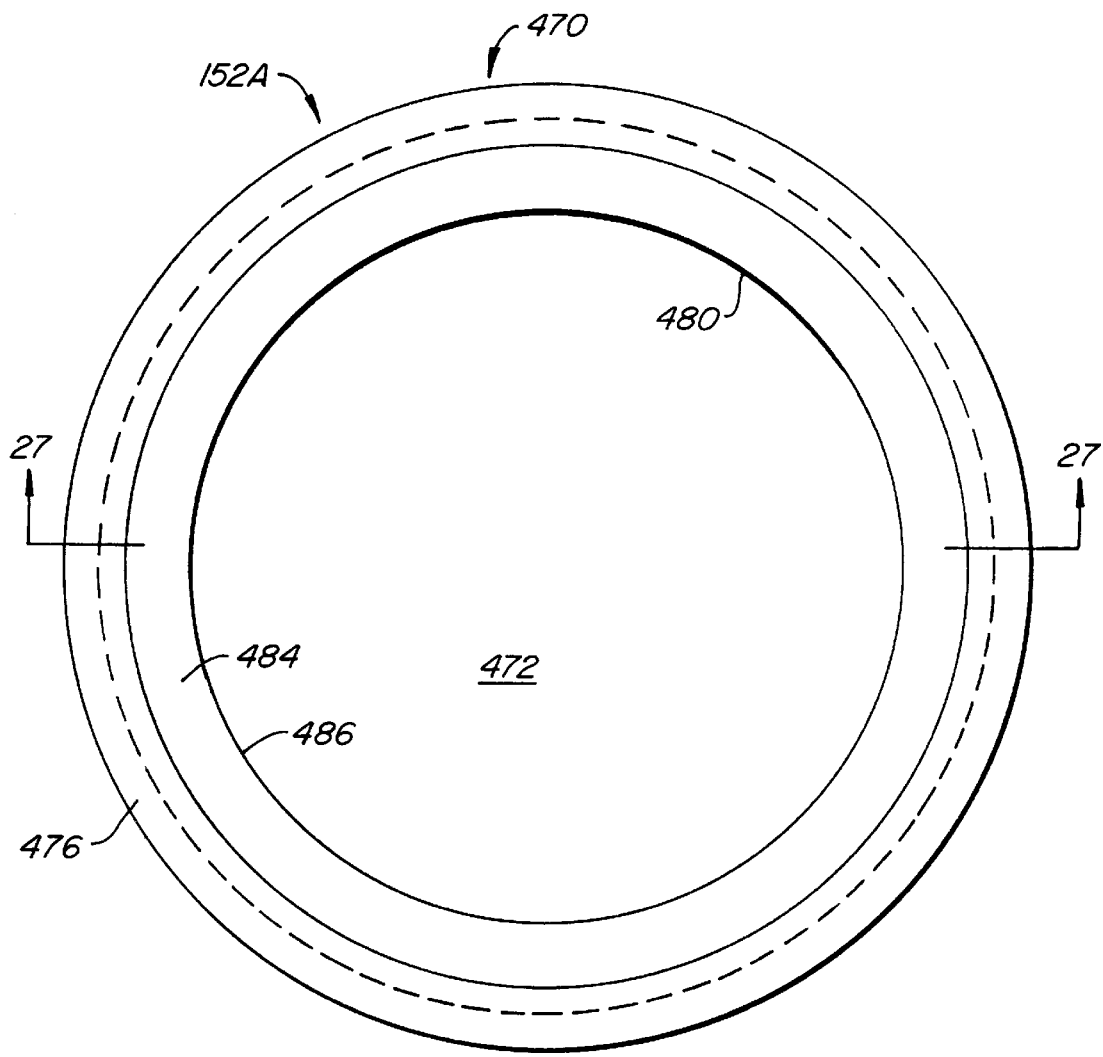
FIG. 26 is a top plan view of the improved isolator ring of the present invention.
Figure 29:
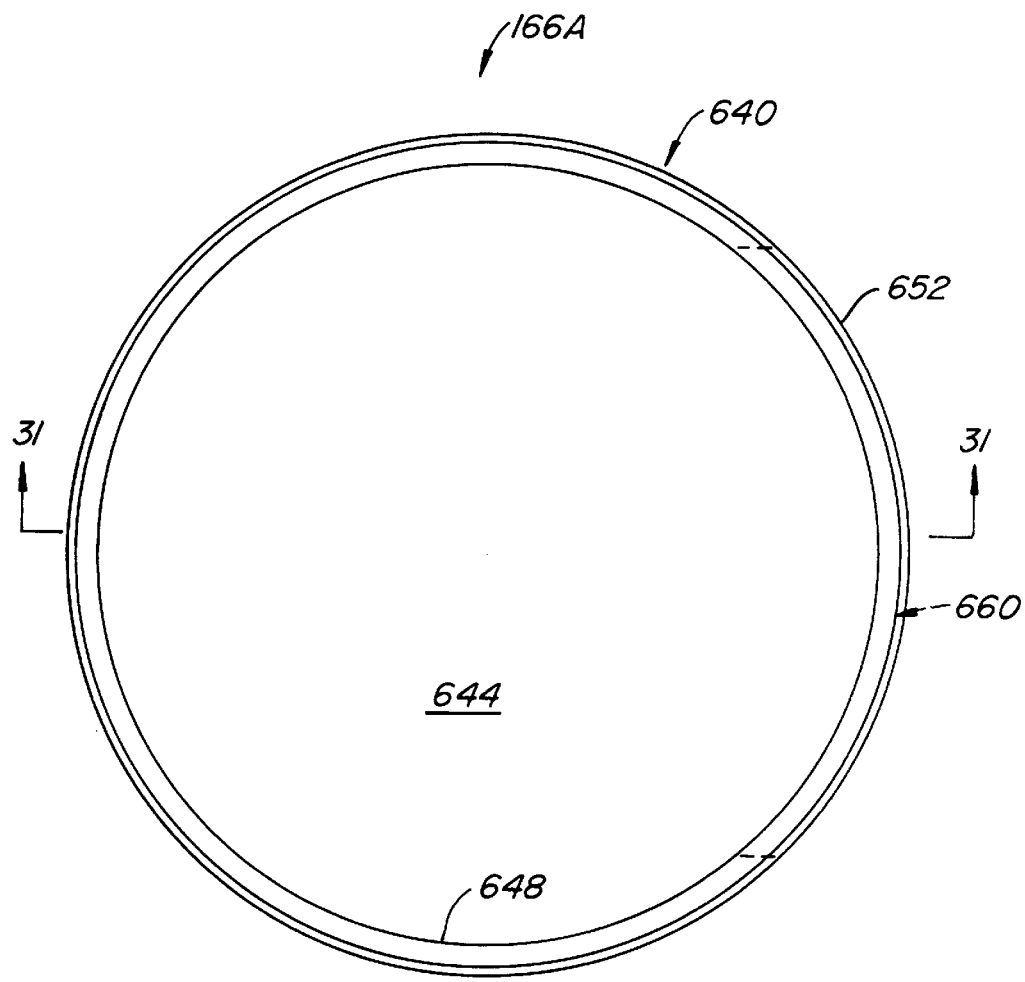
FIG. 29 is a top plan view of the inner shield (or chamber wall insert) of the present invention.
Figure 30:
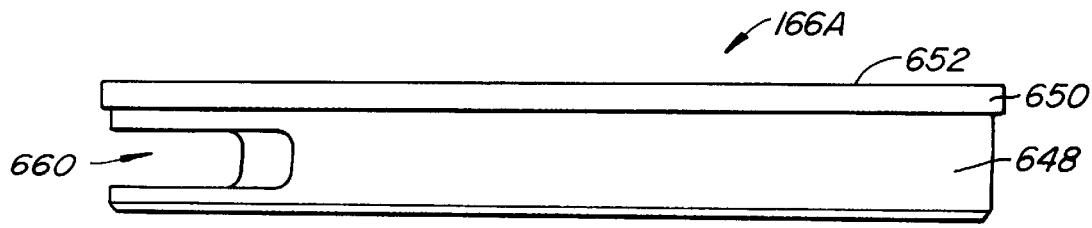
FIG. 30 is a side elevational view of the inner shield of FIG. 29.

The isolator 152A for the embodiment of the invention of FIGS. 22–25 and as best shown in FIGS. 26, 27 and 28, has a ring-line structure 470, preferably manufactured of ceramic, having a central opening 472, an isolator body 474, an upper lip 476 integrally bound to the isolator body 474, and a lower inner lip 478 also integrally bound to the isolator body 474 (see FIG. 28) and protruding inwardly to defame a perimeter 480 of the central opening 472. The isolator body 474 has a lower outer lip 475 with a lower body surface 483. The isolator body 474 also has concave surface 486. The lower lip 478 has a sloping top surface 484 and a front generally upright surface 486 that particularly defines the perimeter 480 and terminates at edge 488 in a lower surface 490 that is generally planar until reaching point 489 wherefrom a sloping surface 491 (which is part of the outer lip 475) extends to a point 494 where it terminates in the lower body surface 483. The sloping surface 491 of the isolator 152A extends downwardly and away from the showerhead 40. The downwardly sloping (ring-like) sloping surface 491 forms an obstruction and a confinement for the processing gas(es) and/or plasma such that the processing gas(es) and/or plasma do not have a straight channel or passageway into the pumping channel 160.

Figure 31:
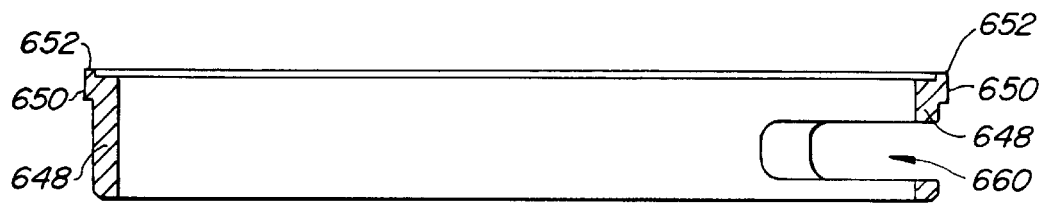
FIG. 31 is a vertical sectional view taken in direction of the arrows and along the plane of line 31—31 in FIG. 29.

Referring now to FIG. 25, there is seen the chamber wall insert assembly, generally illustrated as 154A and comprising a shield, generally illustrated as 166A and a ceramic ring or chamber insert, generally illustrated as 164A. The shield 166A (see FIGS. 29–31) has a ring-like structure 640 which is preferably manufactured from quartz ($SiO_2$). The ring-like structure 640 has a central opening 644, a shield body 648, a shield lip 650 integrally bound to the shield body 648, and a shield ridge 652 integrally bound to the shield lip 650 and protruding above the shield body 648 as best shown in FIG. 31. The shield body 648 also has an opening 660 for allowing the passage of wafers into and out of the reaction or processing chamber.

Figure 32:
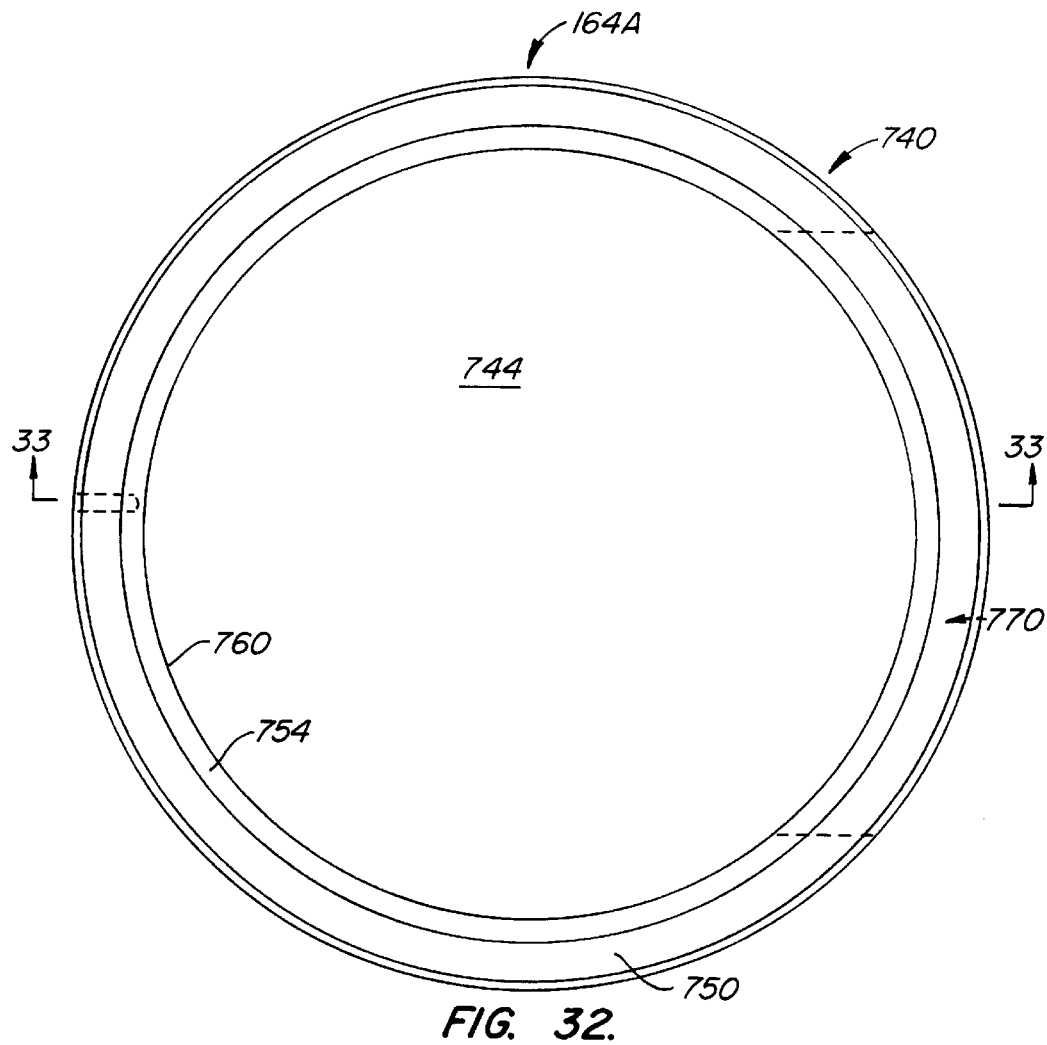
FIG. 32 is a top plan view of the insert chamber of the present invention.

Referring now to FIGS. 32 and 33, there is seen the ceramic ring or chamber insert 164A as having a ring-like structure 740, preferably consisting essentially of quartz ($SiO_2$), including a central opening 744, an insert body 748, a ridge 750 integrally bound to the insert body (see FIG. 33), and a lower lip 754 also integrally bound to the insert body 768 and protruding inwardly to form a perimeter 760 for the central opening 744. The insert body 748 also includes an opening 770 that registers with the opening 660 of the shield body 648 for allowing the passage of wafers into and out of the processing or reaction chamber.

The reaction or processing chamber for the CVD apparatus for the embodiment of the invention illustrated in FIGS. 22–33 may be used for any suitable purpose which would be readily discernible to those artisans possessing ordinary skill in the art and for which the spirit and scope of the present invention would cover. One suitable use for the reaction or processing chamber for this embodiment of the invention would be for forming a CVD layer (e.g. a CVD layer comprising TiN) on the substrate or wafer 142. After the wafer 142 has been loaded onto the pedestal 140 in accordance with the previously mentioned procedures, the pedestal 140, which would preferably be heated to a temperature below 600° C., preferably from about 400° C. to about 500° C. (e.g. about 450° C.), is elevated until the upper surface of the pedestal 140 (including the wafer 142) extends above the edge 494 (and above the surface 483) of the isolator 152A as best shown in FIG. 25. When the pedestal 140 is in such a posture, the sloping surface 491 of the isolator 152A confines any processing gases and/or plasma of the processing gases aver the wafer 142 and the pedestal 140 while the wafer 142 is being processed to form a CVD layer (e.g. a TiN layer) thereon.

The pumping chamber liners 170, 172 and the centering ring 146 can be easily replaced with new or refurbished components whenever films, particularly conductive films, inevitably build up on them. However, testing in a realistic operating environment has shown that even after 3000 wafers, the novel design has minimized the deposition to the point that they do not need to be replaced. Thus, some relatively simple improvements to the equipment peripheral to the pedestal 140, all within the confines of the existing chamber FIG. 1, substantially reduce downtime of the CVD system while providing superior plasma conditions.

Although the invention has been described with respect to thermal CVD of TiN followed by a plasma treatment, the invention is obviously applicable to any process in which the same chamber is used for a thermal metal deposition and another plasma process. For example, the titanium layer 104 can be deposited by a plasma process using $TiCl_4$ as the precursor and using the thermal TDMAT process for the TiN layer. Also, the process can be advantageously applied to CVD of conductive metal oxides, such as perovskites including lanthanum oxide. The combination of deposition of conductive metals and a plasma step would still present the potential problems of a thermal process depositing extraneous metal layers which could affect the plasma process. The invention is of course applicable to many other types of metal CVD processes and should be useful in dielectric CVD and other plasma applications as well.

Thus, while the present invention has been described herein with reference to particular embodiments thereof, a latitude of modification, various changes and substitutions are intended in the foregoing disclosure, and it will be appreciated that in some instances some features of the invention will be employed without a corresponding use of other features without departing from the scope and spirit of the invention as set forth. Therefore, many modifications may be made to adapt a particular situation or material to the teachings of the invention without departing from the essential scope and spirit of the present invention. It is intended that the invention not be limited to the particular embodiment disclosed as the best mode contemplated for carrying out this invention, but that the invention will include all embodiments and equivalents falling within the scope of the appended claims.

What is claimed is:

1. A method for forming a CVD layer on a substrate comprising the steps of:

(a) providing a processing chamber comprising a chamber body, a pedestal movably disposed in the chamber body and including an upper pedestal surface, and a chamber lid assembly supported by the chamber body and including an isolator ring member comprising an isolator ring lip having a sloping surface terminating in a lower lip edge;

(b) disposing a substrate on said pedestal;

(c) elevating said pedestal including said substrate of step (b) until said upper pedestal surface of said pedestal extends above said lower lip edge of said isolator ring lip of said isolator ring member; and (d) processing said substrate including contacting said substrate with a processing gas to form a CVD layer on said substrate.

2. The method of claim 1 additionally comprising heating said pedestal to a temperature less than 600° C.

3. The method of claim 1 wherein said CVD layer comprises TiN.

4. The method of claim 2 wherein said CVD layer comprises TiN.

5. The method of claim 1 wherein said processing step (d) comprises forming a plasma with said processing gas.

6. The method of claim 2 wherein said temperature ranges from about 400° C. to about 500° C.

7. The method of claim 4 wherein said temperature ranges from about 400° C. to about 500° C.

* * * * *